(12) United States Patent
An et al.

(10) Patent No.: US 10,043,453 B2
(45) Date of Patent: Aug. 7, 2018

(54) DISPLAY PANEL AND ELECTRONIC APPARATUS INCLUDING THE SAME

(71) Applicant: SAMSUNG DISPLAY CO., LTD., Yongin-si, Gyeonggi-do (KR)

(72) Inventors: Junyong An, Yongin-si (KR); Sukyoung Kim, Yongin-si (KR); Ae Shin, Yongin-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/447,743

(22) Filed: Mar. 2, 2017

(65) Prior Publication Data

US 2017/0365217 A1 Dec. 21, 2017

(30) Foreign Application Priority Data

Jun. 17, 2016 (KR) ........................ 10-2016-0075833

(51) Int. Cl.
| | |
|---|---|
| *G09G 3/3258* | (2016.01) |
| *G09G 3/3266* | (2016.01) |
| *G09G 3/3291* | (2016.01) |
| *H01L 27/32* | (2006.01) |

(52) U.S. Cl.
CPC ......... *G09G 3/3258* (2013.01); *G09G 3/3266* (2013.01); *G09G 3/3291* (2013.01); *H01L 27/3279* (2013.01); *G09G 2310/0291* (2013.01); *G09G 2320/0646* (2013.01); *G09G 2330/021* (2013.01)

(58) Field of Classification Search
None
See application file for complete search history.

(56) References Cited

U.S. PATENT DOCUMENTS

2011/0102402 A1* 5/2011 Han ................... H01L 27/3279
345/211
2014/0299867 A1* 10/2014 Ono ................... H01L 51/5228
257/40

(Continued)

FOREIGN PATENT DOCUMENTS

KR 10-2015-0145219 A 12/2015
KR 10-2016-0026429 A 3/2016

(Continued)

*Primary Examiner* — Nicholas Lee
(74) *Attorney, Agent, or Firm* — Lee & Morse, P.C.

(57) ABSTRACT

A display panel including a substrate that includes a display region and a non-display region, the display region including a first and second display region spaced apart from each other, and the non-display region including an edge non-display region that surrounds the display region and an intermediate non-display region between the first and second display region; a plurality of first pixels arranged on the first display region; a plurality of second pixels arranged on the second display region; a first and second voltage wiring on the non-display region to transmit a first and second driving voltage to the first and second pixel; and an auxiliary wiring extending in a second direction perpendicular to the first direction, on the intermediate non-display region, the auxiliary wiring crossing between the first and second display region, and being connected to one of the first and second voltage wiring.

20 Claims, 17 Drawing Sheets

(56) References Cited

U.S. PATENT DOCUMENTS

| | | | |
|---|---|---|---|
| 2014/0368416 A1* | 12/2014 | Gu | G09G 3/3233 |
| | | | 345/78 |
| 2015/0035861 A1 | 2/2015 | Salter et al. | |
| 2015/0084938 A1 | 3/2015 | Kim | |
| 2016/0062454 A1 | 3/2016 | Wang et al. | |
| 2016/0086549 A1 | 3/2016 | Eom | |
| 2016/0203765 A1* | 7/2016 | Lee | G09G 3/3291 |
| | | | 345/76 |

FOREIGN PATENT DOCUMENTS

| | | |
|---|---|---|
| KR | 10-2016-0036155 A | 4/2016 |
| KR | 10-2016-0039267 A | 4/2016 |

\* cited by examiner

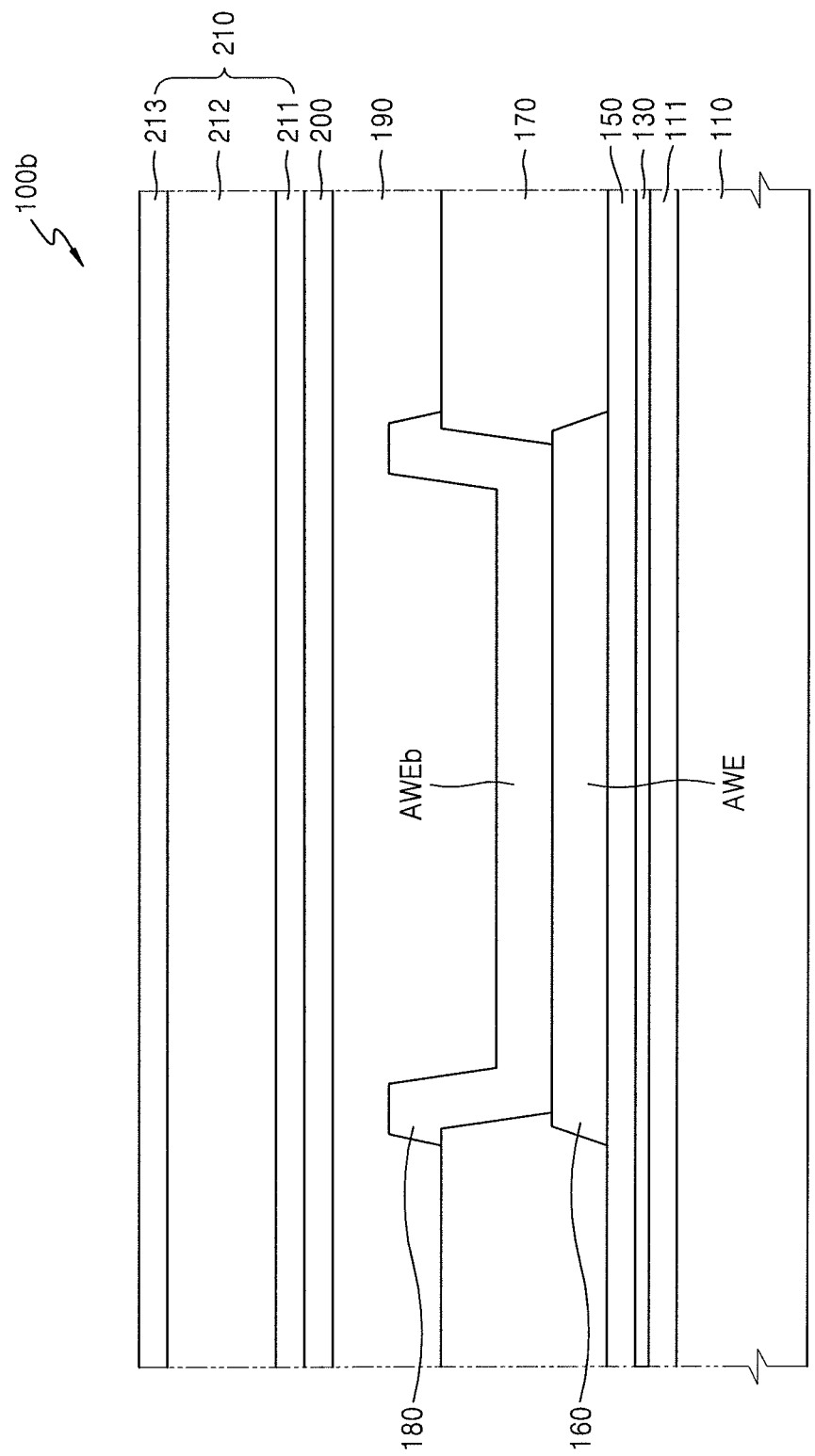

DISPLAY PANEL AND ELECTRONIC APPARATUS INCLUDING THE SAME

CROSS-REFERENCE TO RELATED PATENT APPLICATION

Korean Patent Application No. 10-2016-0075833, filed on Jun. 17, 2016, in the Korean Intellectual Property Office, and entitled: "Display Panel and Electronic Apparatus Including the Same," is incorporated by reference herein in its entirety.

BACKGROUND

1. Field

Embodiments relate to a display panel and an electronic apparatus including the same.

2. Description of the Related Art

Organic light-emitting display apparatuses display images by using an organic light-emitting diode that generates light due to recombination of electrons and holes, and provide a fast response and are driven with low consumption power.

Organic light-emitting display apparatuses may include a plurality of gate lines, a plurality of data lines, a plurality of voltage lines, and a plurality of pixels connected to the lines and arranged in a matrix form.

SUMMARY

The embodiments may be realized by providing a display panel, including a substrate that includes a display region and a non-display region defined therein, the display region including a first display region and a second display region spaced apart from each other in a first direction, and the non-display region including an edge non-display region that surrounds the display region and an intermediate non-display region between the first display region and second display region; a plurality of first pixels arranged on the first display region; a plurality of second pixels arranged on the second display region; a first voltage wiring and a second voltage wiring on the non-display region to transmit a first driving voltage and a second driving voltage to the first pixel and the second pixel, respectively; and an auxiliary wiring extending in a second direction, which is perpendicular to the first direction, on the intermediate non-display region, the auxiliary wiring completely crossing between the first display region and the second display region, and being connected to one of the first voltage wiring and the second voltage wiring.

An interval between the first display region and the second display region may be greater than a width of each of the first pixels and second pixels in the first direction.

A width of the auxiliary wiring in the first direction may be greater than a width of each of the first pixels and second pixels in the first direction.

The first voltage wiring may include a first portion directly connected to a first end of the auxiliary wiring on the edge non-display region and extending in the first direction; and a second portion directly connected to a second end of the auxiliary wiring on the edge non-display region and extending in the first direction.

The second voltage wiring may include a first portion directly connected to a first end of the auxiliary wiring on the edge non-display region and extending in the first direction; and a second portion directly connected to a second end of the auxiliary wiring on the edge non-display region and extending in the first direction.

The first voltage wiring may include a first portion and a second portion, the first portion and second portion completely crossing between the first display region and the second display region on the intermediate non-display region, and the first portion and second portion of the first voltage wiring may have the auxiliary wiring therebetween, and each of the first portion and second portion extends parallel to the auxiliary wiring.

The first voltage wiring may include a first portion that extends in the second direction on the intermediate non-display region and completely crosses between the first display region and second display region, and overlaps the auxiliary wiring.

The display panel may further include first gate lines each extending in the first direction on the first display region and each connected to first pixels on an identical row among the first pixels; second gate lines each extending in the first direction on the second display region and each connected to second pixels on an identical row among the second pixels; a first gate driving circuit between the first display region and the auxiliary wiring on the intermediate non-display region to drive the first gate lines; and a second gate driving circuit between the second display region and the auxiliary wiring on the intermediate non-display region to drive the second gate lines.

The display panel may further include a protection layer directly connected to the auxiliary wiring and covering the first gate driving circuit and second gate driving circuit on the intermediate non-display region.

The substrate may include at least one transparent region within the intermediate non-display region, and the auxiliary wiring may include at least one opening corresponding to the at least one transparent region.

The display panel may further include first voltage lines each extending in the second direction on the first display region and each connected to first pixels on an identical column among the first pixels; and second voltage lines each extending in the second direction on the second display region and each connected to second pixels on an identical column among the second pixels, wherein the first voltage wiring may include a first portion directly connected to first ends of the first voltage lines on the edge non-display region and extending in the first direction; a second portion directly connected to second ends of the first voltage lines on the edge non-display region and extending in the first direction; a third portion directly connected to first ends of the second voltage lines on the edge non-display region and extending in the first direction; and a fourth portion directly connected to second ends of the second voltage lines on the edge non-display region and extending in the first direction.

The display panel may further include a common electrode directly connected to the second voltage wiring and entirely covering the first display region and second display region to apply the second driving voltage to the first pixels and second pixels.

Each of the first pixels and second pixels may include a light-emitting device and a pixel circuit that generates light-emission current flowing in the light-emitting device, the light-emitting device may include a pixel electrode, a common electrode to which the second driving voltage is applied, and an intermediate layer between the pixel electrode and the common electrode, and the pixel circuit may be connected to the pixel electrode, the first driving voltage is applied to the pixel circuit, and the pixel circuit includes at least one thin film transistor.

The display panel may further include an active layer on the substrate, the active layer including a source region, a channel region, and a drain region of the at least one thin film transistor; a first conductive layer on the substrate, the first conductive layer including a gate electrode of the at least one thin film transistor that overlaps the channel region; a second conductive layer on the first conductive layer, the second conductive layer including a connection electrode that connects one of the source region and the drain region to the pixel electrode; a third conductive layer on the second conductive layer, the third conductive layer including the pixel electrode; and a common electrode on the third conductive layer.

The auxiliary wiring may include an auxiliary wiring electrode of the second conductive layer.

The auxiliary wiring may include an auxiliary wiring electrode and a lower auxiliary wiring electrode of the first conductive layer, the lower auxiliary wiring electrode being connected to a lower part of the auxiliary wiring electrode.

The auxiliary wiring may include an auxiliary wiring electrode and an upper auxiliary wiring electrode of the third conductive layer, the upper auxiliary wiring electrode being connected to an upper part of the auxiliary wiring electrode.

The embodiments may be realized by providing an electronic apparatus including the display panel according to an embodiment; a power supply to supply the first driving voltage and second driving voltage to the display panel; and a processor to provide image data to the display panel.

The electronic apparatus may further include a first optical system in front of the first display region of the display panel; and a second optical system in front of the second display region of the display panel.

The electronic apparatus may be a head mounted display apparatus mountable on a head or a face.

BRIEF DESCRIPTION OF THE DRAWINGS

Features will be apparent to those of skill in the art by describing in detail exemplary embodiments with reference to the attached drawings in which:

FIG. 4C illustrates a schematic cross-sectional view of a display panel taken along line IV-IV of FIG. 1, according to another embodiment;

DETAILED DESCRIPTION

Figure 1:
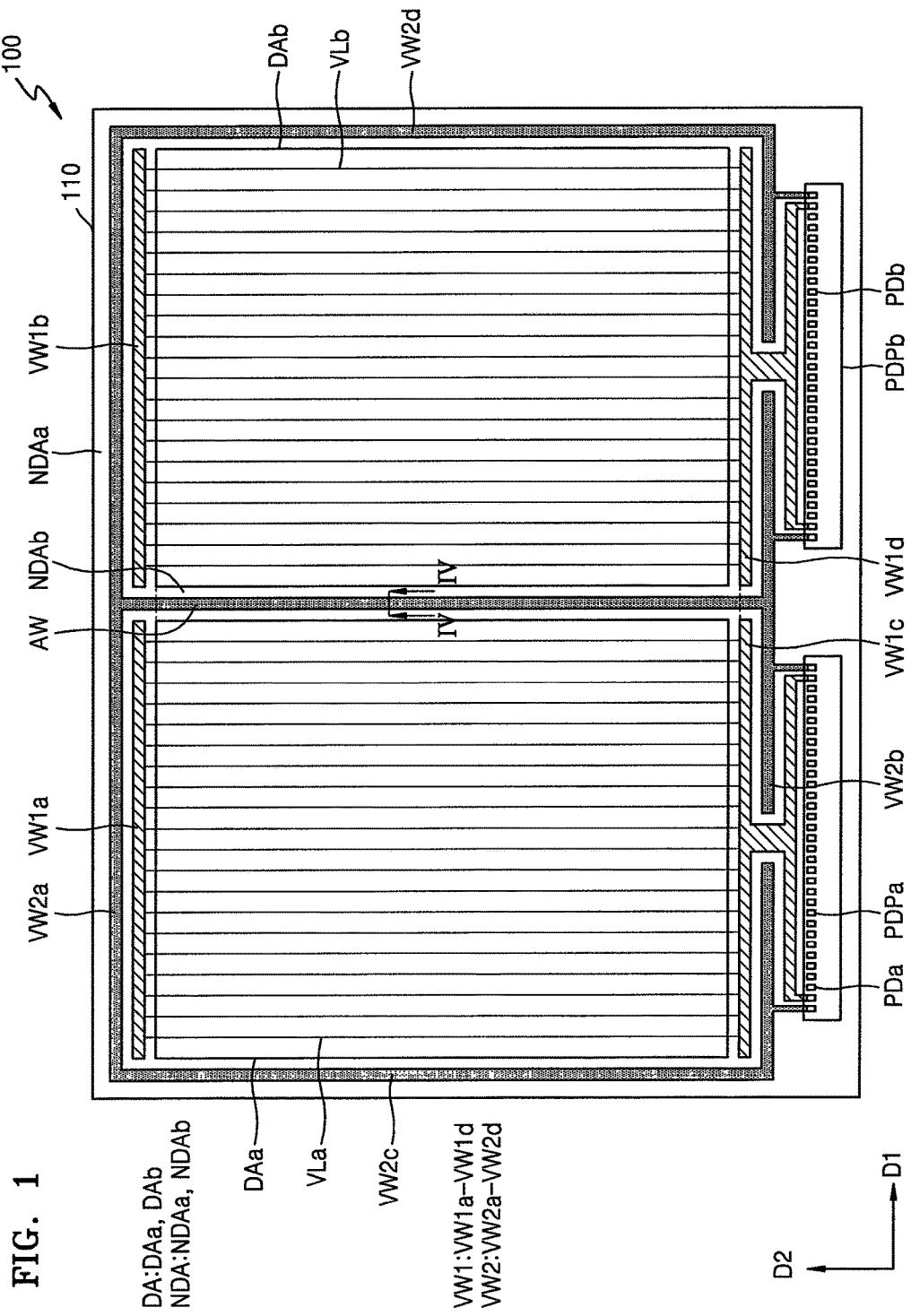
FIG. 1 illustrates a schematic plan view of a display panel according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

It will be understood that although the terms "the first", "the second", etc. may be used herein to describe various components, these components should not be limited by these terms. These components are only used to distinguish one component from another. An expression used in the singular encompasses the expression in the plural, unless it has a clearly different meaning in the context. It will be further understood that the terms "comprises," "includes," "including," and/or "comprising" used herein specify the presence of stated features or components, but do not preclude the presence or addition of one or more other features or components. It will be understood that when a component, such as a layer, region, or member, is referred to as being "on" another component, it can be directly or indirectly on the other component. For example, intervening components may be present.

When an embodiment may be modified and implemented, embodiments are not limited to an order described in the present specification. For example, two consecutively described processes may be performed substantially at the same time or performed in an order opposite to the described order.

FIG. 1 illustrates a schematic plan view of a display panel 100 according to an embodiment.

Referring to FIG. 1, the display panel 100 may include a substrate 110 in which a display region DA and a non-display region NDA are defined, pixels PX (see FIG. 2), first and second voltage wirings VW1 and VW2, and an auxiliary wiring AW.

The display region DA may include first and second display regions DAa and DAb spaced apart from each other in a first direction D1. The non-display region NDA may include an edge non-display region NDAa that surrounds the display region DA, and an intermediate non-display region NDAb between the first and second display regions DAa and DAb. The pixels PX may be arranged on the first and second display regions DAa and DAb. The first and second voltage wirings VW1 and VW2 may be disposed on the non-display region NDA, and may respectively transmit first and second driving voltages ELVDD and ELVSS, which are applied to the pixels PX. The auxiliary wiring AW may extend in a second direction D2, which is perpendicular to the first direction D1, on the intermediate non-display region NDAb, may completely cross between the first and second display regions DAa and DAb, and may be connected to one of the first and second voltage wirings VW1 and VW2. For example, the auxiliary wiring AW may completely separate the first and second display regions DAa and Dab.

On the display region DA of the substrate 110, the pixels PX may be arranged in the first direction D1 and the second direction D2 to form a matrix. The first direction D1 may be referred to as a row direction and the second direction D2 may be referred to as a column direction.

The pixels PX on the first display region DAa may be referred to as first pixels, and the pixels PX on the second display region DAb may be referred to as second pixels.

Each of the pixels PX may include a light-emitting device (e.g., an organic light-emitting diode (OLED)) or a display device (e.g., a liquid crystal layer), and a pixel circuit for driving the light-emitting device or the display device. The pixel circuit may include at least one thin film transistor.

On the display region DA, the pixels PX may express a grayscale and thus an image may be displayed. On the display region DA, the pixels PX may be arranged. The display region DA may include light-emission regions on which the light-emitting devices of the pixels PX are disposed and thus light may be actually emitted, and non light-emission regions between the light-emission regions of the pixels PX. The non light-emission regions of the display region DA may correspond to boundaries between the pixels PX.

The first display region DAa and the second display region DAb may be spaced apart from each other in the first direction D1. The first display region DAa and the second display region DAb may have substantially the same sizes, and a same number of pixels PX may be arranged on each of the first display region DAa and the second display region DAb.

On the first and second display regions DAa and DAb, gate lines GL (see FIG. 2), data lines DL (see FIG. 2), and voltage lines VL (see FIG. 2) may be arranged, which are connected to the pixels PX, respectively.

Each of the gate lines GL may extend in the first direction D1, and may be connected to pixels PX on the same row to transmit gate signals, such as scan signals, to the pixels PX. The gate lines GL on the first display region DAa may be referred to as first gate lines, and the gate lines GL on the second display region DAb may be referred to as second gate lines.

Each of the data lines GL may extend in the second direction D2, and may be connected to pixels PX on the same column to transmit a data signal having a data voltage to the pixels PX. The data lines DL on the first display region DAa may be referred to as first data lines, and the data lines DL on the second display region DAb may be referred to as second data lines.

Each of the voltage lines VL may extend in the second direction D2 and may provide a first driving voltage ELVDD to pixels PX in a column direction that are connected to each of the voltage lines VL. For example, each of the voltage lines VL may be connected to the pixels PX on the same column. The voltage lines VL on the first display region DAa may be referred to as first voltage lines VLa, and the voltage lines VL on the second display region DAb may be referred to as second voltage lines VLb.

The pixels PX will be described later in more detail with reference to FIGS. 2 and 3.

On the non-display region NDA, no images may be displayed. The non-display region NDA may be understood as a region of the substrate 110 except for or other than the display region DA. The non-display area NDA may be divided into the edge non-display region NDAa and the intermediate non-display region NDAb. The intermediate non-display region NDAb may be defined as a region between the first and second display regions DAa and DAb. The edge non-display region NDAa may be defined as a region that surrounds the first display region DAa, the intermediate non-display region NDAb, and the second display region DAb. As shown in FIG. 1, the intermediate non-display region NDAb may be a consecutive region that continuously extends from two points on the edge non-display region NDAa to the center, and a boundary between the edge non-display region NDAa and the intermediate non-display region NDAb may be virtual.

On the edge non-display region NDAa, the first and second voltage wirings VW1 and VW2 (for transmitting the first and second driving voltages ELVDD and ELVSS used for driving the pixels PX) may be arranged.

In an implementation, on the edge non-display region NDAa, signal wirings for transmitting control signals and data signals in order to drive the pixels PX may be arranged.

On the edge non-display region NDAa, first and second pad units PDPa and PDPb, on which first and second pads PDa and PDb are arranged thereon, respectively, may be arranged. The first pads PDa may be terminals to which signals and voltages for driving the pixels PX on the first display region DAa are applied, and the second pads PDb may be terminals to which signals and voltages for driving the pixels PX on the second display region DAb may be applied. The number of first pads PDa may be the same as the number of second pads PDb, and/or the first and second pads PDa and PDb may have the same configurations.

According to an embodiment, the first and second pad units PDPa and PDPb may include display driving chips for driving the display panel 100, respectively, mounted thereon. According to another embodiment, a display driving chip may be mounted on a flexible printed circuit board (PCB), and the flexible PCB may be connected to each of the first and second pad units PDPa and PDPb. According to an embodiment, a display driving chip may include a power supply capable of generating voltages, such as the first and second driving voltages ELVDD and ELVSS. According to another embodiment, a power chip capable of generating the first and second driving voltages ELVDD and ELVSS may be connected to pads connected to the first and second voltage wirings VW1 and VW2 among the first and second pads PDa and PDb, via a flexible PCB.

Some of the first and second pads PDa and PDb may be connected to the first and second voltage wirings VW1 and VW2. As shown in FIG. 1, at least one of the first pads PDa may be connected to the first voltage wiring VW1, and at least one of the other first pads PDa may be connected to the second voltage wiring VW2. At least one of the second pads PDb may be connected to the first voltage wiring VW1, and at least one of the other second pads PDb may be connected to the second voltage wiring VW2. Other voltages for driving the pixels PX, such as an initialization voltage, a reference voltage, a logic high voltage, or a logic low voltage, may be applied to some the other first and second pads PDa and PDb.

Some of the first and second pads PDa and PDb may be connected to the signal wirings. For example, some of the first and second pads PDa and PDb may receive data signals, and may be connected to the data lines on the first and second display regions DAa and DAb, via, e.g., fan-out wirings. Some the other first and second pads PDa and PDb may receive control signals, such as a clock signal, and may be connected to a gate driving circuit via the wirings on the edge non-display region NDAa.

As shown in FIG. 1, the first voltage wiring VW1 may include a first portion VW1a disposed on an upper side of the first display region DAa, a second portion VW1b disposed on an upper side of the second display region DAb, a third portion VW1c disposed on a lower side of the first display region DAa and connected to some of the first pads PDa, and a fourth portion VW1d disposed on a lower side of the second display region DAb and connected to some of the second pads PDb. The first through fourth portions VW1a through VW1d may be located on the edge non-display region NDAa. The upper side and the lower side are determined according to a direction in which FIG. 1 is viewed, for ease of explanation.

The first portion VW1a may be directly connected to first ends of the first voltage lines VLa on the first display region DAa, and the second portion VW1b may be directly connected to first ends of the second voltage lines VLb on the second display region DAb. The third portion VW1c may be directly connected to second ends of the first voltage lines VLa on the first display region DAa and thus may transmit, to the first voltage lines VLa, first driving voltages ELVDD that are received via some of the first pads PDa. The fourth portion VW1d may be directly connected to second ends of the second voltage lines VLb on the second display region DAb and thus may transmit, to the second voltage lines VLb, first driving voltages ELVDD that are received via some of the second pads PDb.

As described above, the pixels PX may be connected to the first voltage lines VLa and the second voltage lines VLb, and currents that the pixels PX consume to emit light may flow in the first voltage lines VLa and the second voltage lines VLb. The first voltage lines VLa and the second voltage lines VLb may have resistance components, and as more current is consumed by the pixels PX, a voltage drop (or an IR drop) could occur. For example, even when data signals having the same data voltage are transmitted to the pixels PX, the pixels PX located in lower portions of the first and second display regions DAa and Dab and adjacent to the third and fourth portions VW1c and VW1d may emit light brightly, whereas the pixels PX located in upper portions of the first and second display regions DAa and DAb may emit light darkly (e.g., with relatively lower intensity). Only some portions of the first and second display regions DAa and DAb may consume a large amount of current, and the first portion VW1a and the second portion VW1b may compensate for a locally-occurring voltage drop. In an implementation, the first portion VW1a and the second portion VW1b may be omitted.

As shown in FIG. 1, the second voltage wiring VW2 may include a first portion VW2a disposed in an upper portion of the edge non-display region NDAa, a second portion VW2b disposed on a lower portion of the edge non-display region NDAa and connected to some of the first pads PDa and some of the second pads PDb, and a third portion VW2c and a fourth portion VW2d disposed on both lateral portions of the edge non-display region NDAa.

The second voltage wiring VW2 may be connected to a common electrode 200 (see FIG. 3) that completely covers the first and second display regions DAa and DAb in order to apply the second driving voltage ELVSS to the pixels PX.

The common electrode 200 may be directly connected to the second voltage wiring VW2. For example, a whole upper surface of the second voltage wiring VW2 may be connected to the common electrode 200. For a simple connection between the second voltage wiring VW2 and the common electrode 200, the second voltage wiring VW2 may be located around the first voltage wiring VW1, as shown in FIG. 1.

A portion of the common electrode 200 that is adjacent to the second voltage wiring VW2 may have substantially the same voltage level as the second driving voltage ELVSS, but a center portion of the common electrode 200 that is far from the second voltage wiring VW2 may have a higher voltage level than the second driving voltage ELVSS due to a voltage drop. Accordingly, the pixels PX located on the center of the display panel 100 may emit light darkly, e.g., with a relatively lower brightness or intensity.

The auxiliary wiring AW connected to the second voltage wiring VW2 may be disposed on the intermediate non-display region NDAb. A width of the intermediate non-display region NDAb in the first direction D1, e.g., an interval between the first display region DAa and the second display region DAb, may be greater than a width of each pixel PX in the first direction D1. For example, the width of the intermediate non-display region NDAb in the first direction D1 may be greater than 300 μm. For example, the width of the intermediate non-display region NDAb in the first direction D1 may be greater than 500 μm or greater than 1,000 μm. For example, the width of the intermediate non-display region NDAb in the first direction D1 may be greater than the width of each pixel PX in the first direction D1 by three times, five times, or ten times.

The auxiliary wiring AW may be directly connected between the first portion VW2a and the second portion VW2b of the second voltage wiring VW2. The auxiliary wiring AW may be simultaneously and integrally formed with the second voltage wiring VW2. The auxiliary wiring AW may extend in the second direction D2 and may completely pass between the first and second display regions DAa and DAb. For example, a length of the auxiliary wiring AW in the second direction D2 may be equal to or greater than a length of the intermediate non-display region NDAb in the second direction D2.

The width of the auxiliary wiring AW in the first direction D1 may be greater than the width of each pixel PX in the first direction D1. In an implementation, the width of the auxiliary wiring AW in the first direction D1 may be greater than 50 μm. In an implementation, the width of the auxiliary wiring AW in the first direction D1 may be greater than 100 μm.

The auxiliary wiring AW connected to the second voltage wiring VW2 may be directly connected to the common electrode 200. As described above, if no auxiliary wirings AW were to be included, the pixels PX located on or near the center of the display panel 100 could emit light with a lower brightness or intensity due to a voltage drop. However, according to an embodiment, the auxiliary wiring AW may pass through the center of the display panel 100 and thus a voltage having the same level as the second driving voltage ELVSS may also be applied to the pixels PX located on or near the center of the display panel 100, and the pixels PX located on the center of the display panel 100 may also emit light brightly (e.g., the pixels PX may emit light having a relatively uniform brightness). Accordingly, brightness uniformity may improve, and accordingly, a display quality may also improve.

The pixels PX arranged on the display region DA will now be described with reference to FIGS. 2 and 3.

Figure 2:
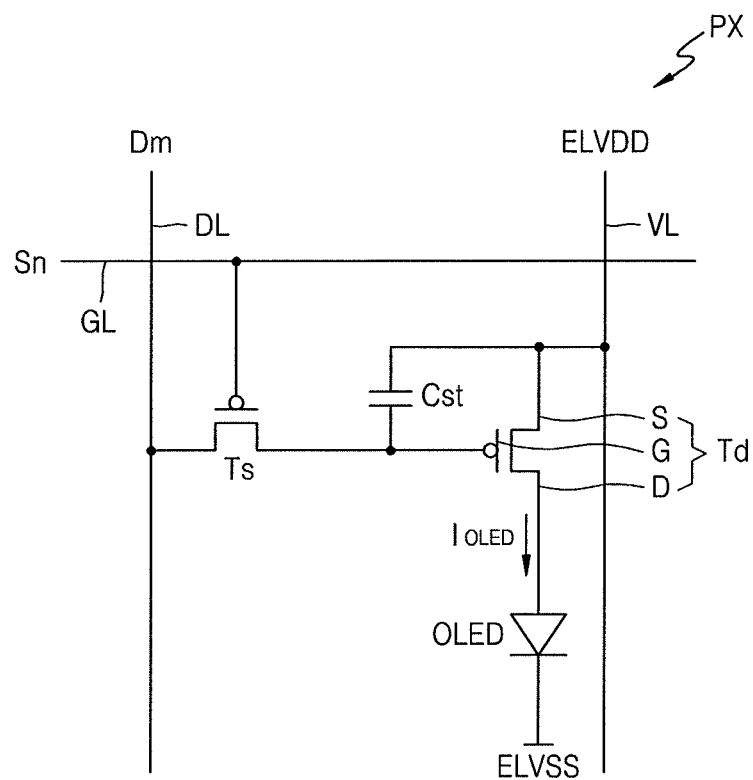
FIG. 2 illustrates an equivalent circuit diagram of an exemplary pixel on a display region of FIG. 1.

FIG. 2 illustrates an equivalent circuit diagram of an exemplary pixel PX on the display region DA of FIG. 1.

Referring to FIG. 2, the pixel PX may include a light-emitting device, such as an organic light-emitting diode OLED, and a pixel circuit that generates light-emission current flowing in the light-emitting device. The light-emitting device may be an organic light-emitting diode OLED including a pixel electrode 181 (see FIG. 3), the common electrode 200 (see FIG. 3), and an intermediate layer 195 (see FIG. 3) including an organic emissive layer between the pixel electrode 181 and the common electrode 200. The second driving voltage ELVSS may be applied to the common electrode 200, which is able to serve as a cathode of the organic light-emitting diode OLED, via the second voltage wiring VW2. The common electrode 200 may be disposed on the entire area of the display region DA.

The pixel circuit of FIG. 2 may include two thin film transistors, e.g., a switching thin film transistor Ts and a driving thin film transistor Td, and a single capacitor Cst. The pixel circuit may be connected to a gate line GL that transmits a scan signal Sn, a data line DL that transmits a data signal Dm, and a voltage line VL that transmits the first driving voltage ELVDD. A voltage level of the first driving voltage ELVDD may be higher than that of the second driving voltage ELVSS.

A source S of the driving thin film transistor Td may be connected to the voltage line VL, and a drain D thereof may be connected to the pixel electrode 181 of the organic light-emitting diode OLED. The capacitor Cst may be connected between a gate G of the driving thin film transistor Td and the voltage line VL. The switching thin film transistor Ts may be connected to the gate line GL, the data line DL, and the gate G of the driving thin film transistor Td and thus transmits the data signal Dm to the gate G of the driving thin film transistor Td in response to the scan signal Sn. The data signal Dm may be transmitted to the gate G of the driving thin film transistor Td, as a data voltage, and the capacitor Cst stores a voltage corresponding to a difference between the first driving voltage ELVDD and the data voltage.

The driving thin film transistor Td may generate light-emission current $I_{OLED}$, based on a voltage between both terminals of the capacitor Cst connected between the gate G and the source S of the driving thin film transistor Td, and may output the light-emission current $I_{OLED}$ to the organic light-emitting diode OLED. The organic light-emitting diode OLED may emit light with a brightness corresponding to the magnitude of the light-emission current $I_{OLED}$.

In an implementation, a pixel PX may include two thin film transistors and one capacitor, as illustrated in FIG. 2. In an implementation, a pixel PX may include at least two thin film transistors and at least one capacitor. In an implementation, both the switching and driving thin film transistors Ts and Td have p-type conductivity, as illustrated in FIG. 2. In an implementation, all of the thin film transistors included in a pixel PX may have n-type conductivity. In an implementation, some of the thin film transistors included in a pixel PX may have p-type conductivity, and the others may have n-type conductivity.

In an implementation, the pixel electrode 181 may be an anode of the organic light-emitting diode OLED and the common electrode 200 may be the cathode of the organic light-emitting diode OLED as illustrated in FIG. 2. In an implementation, the opposite to the case of FIG. 2 is possible. In an implementation, the pixel electrode 181 may serve as the cathode of the organic light-emitting diode OLED, and the common electrode 200 may serve as the anode of the organic light-emitting diode OLED. In this case, the level of the second driving voltage ELVSS applied to the common electrode 200 by the second voltage wiring VW2 may be higher than that of the first driving voltage ELVSS applied to the pixel circuit by the first voltage wiring VW1.

Figure 3:
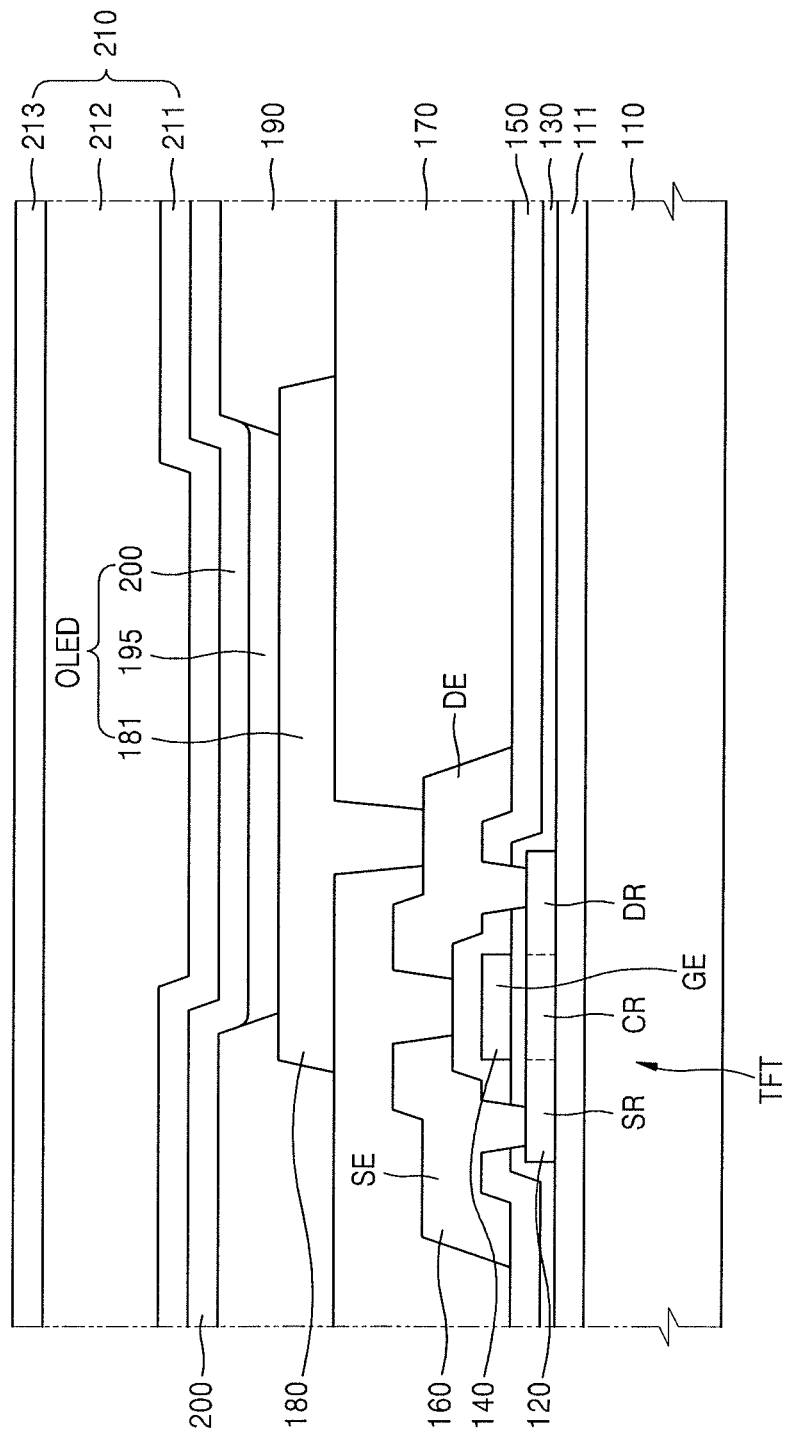
FIG. 3 illustrates a cross-section of an exemplary pixel on the display region of FIG. 1.

FIG. 3 illustrates a cross-section of an exemplary pixel PX on the display region DA of FIG. 1.

Referring to FIG. 3, a thin film transistor TFT may be on a substrate 110, and an organic light-emitting diode OLED may be connected to the thin film transistor TFT. The organic light-emitting diode OLED may include the pixel electrode 181 included in a third conductive layer 180, the intermediate layer 195, and the common electrode 200. The thin film transistor TFT may correspond to the driving thin film transistor Td of FIG. 2.

A buffer layer 111 may be on the substrate 110, an active layer 120 may be on the buffer layer 111, a first insulating layer 130 may be on the active layer 120, a first conductive layer 140 may be on the first insulating layer 130, a second insulating layer 150 may be on the first conductive layer 140, a second conductive layer 160 may be on the second insulating layer 150, a third insulating layer 170 may be on the second conductive layer 160, the third conductive layer 180 may be on the third insulating layer 170, a pixel defining layer 190 may be on the third conductive layer 180, the common electrode 200 may be on the pixel defining layer 190, and a thin film encapsulation layer 210 may be on the common electrode 200.

The substrate 110 may be an insulative substrate formed of glass, or plastic (e.g., polyethylene terephthalate (PET), polyethylene naphthalate (PEN), or polyimide). The substrate 110 may be a conductive substrate including a metal layer. The substrate 110 may be a flexible substrate or a rigid substrate.

The buffer layer 111 may be disposed on the substrate 110 to help prevent diffusion of impurity ions and infiltration of moisture or external air and to provide a planarized surface to the substrate 110. The buffer layer 111 may include an oxide layer (e.g., a silicon oxide (SiOx) layer) and/or a nitride layer (e.g., a silicon nitride (SiNx) layer.

The active layer 120 may include a source region SR, a channel region CR, and a drain region DR of a thin film transistor TFT. The active layer 120 may have any of various planar shapes according to design.

The active layer 120 may be formed of polycrystalline silicon. According to another embodiment, the active layer 120 may be formed of amorphous silicon, or oxide semiconductor (e.g., a G-I—Z—O layer [$(In_2O_3)a(Ga_2O_3)b(ZnO)c$ layer]), wherein a, b, and c are real numbers that respectively satisfy a≥0, b≥0, and c>0. A case where the active layer 120 is formed of polycrystalline silicon will now be described for convenience of explanation.

Impurities at high concentrations may be injected into the source region SR and the drain region DR. The impurities may include, e.g., n-type impurities (e.g., elements in Group 5 of the Periodic Table, such as phosphorus (P), arsenic (As), and antimony (Sb)) or p-type impurities (e.g., elements in Group 3 of the Periodic Table, such as boron (B), gallium (Ga), and indium (In)).

A lightly-doped region may be disposed between the source region SR and the channel region CR and between the channel region CR and the drain region DR in order to help prevent a strong electric field from being induced between the source region SR and the channel region CR and between the channel region CR and the drain region DR.

The first insulating layer 130 on the active layer 120 may serve as a gate insulation layer and may include an inorganic material including oxide or nitride. For example, the first insulating layer 130 may include an insulative material, such as silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$), and may include a single layer or multiple layers.

The first conductive layer 140 on the first insulating layer 130 may include a gate electrode GE of the thin film transistor TFT. The gate electrode GE may overlap the channel region CR, and a channel that connects the source region SR to the drain region DR may be formed in the channel region CR according to a voltage that is applied to the gate electrode GE. The first conductive layer 140 may include, e.g., molybdenum (Mo), aluminum (Al), copper (Cu), or titanium (Ti), and may include a single layer or multiple layers. The first conductive layer 140 may be referred to as a gate electrode layer. In an implementation, the first conductive layer 140 may include the gate line GL of FIG. 2, which transmits the scan signal Sn.

The second insulating layer 150 on the first conductive layer 140 may include an inorganic material including oxide or nitride. For example, the third insulating layer 170 may include an insulative material, such as silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$), and may include a single layer or multiple layers. The second insulating layer 150 may include an organic material. The second insulating layer 150 may be referred to as an interlayer insulating layer.

The second conductive layer 160 on the second insulating layer 150 may include a source electrode SE and a drain electrode DE of the thin film transistor TFT. The source electrode SE may be connected to the source region SR via a contact plug, and the drain electrode DE may be connected to the drain region DR via a contact plug. The drain electrode DE may connect the drain region DR to the pixel electrode 181, and may be referred to as a connection electrode. In an implementation, according to a design of each pixel PX, the source electrode SE or the drain electrode DE may be omitted. In this case, the source electrode SE or the drain electrode DE may be connected to another thin film transistor or another element via a wiring region having conductivity within the active layer 120. In an implementation, the second conductive layer 160 may include the data line DL of FIG. 2, which transmits the data signal Dm, and the voltage line VL of FIG. 2, which transmits the first driving voltage ELVDD. The second conductive layer 160 may include, e.g., molybdenum (Mo), aluminum (Al), copper (Cu), or titanium (Ti), and may include a single layer or multiple layers. The third conductive layer 180 may have a multi-layer structure of Ti/Al/Ti. The second conductive layer 160 may be referred to as a source drain electrode layer.

The third insulating layer 170 on the second conductive layer 160 may include an organic material, e.g., acryl, benzocyclobutene (BCB), polyimide, or hexamethyldisiloxane (HMDSO), and may include a single layer or multiple layers. The third insulating layer 170 may include an inorganic material. The third insulating layer 170 may be referred to as a planarization insulating layer.

The third conductive layer 180 on the third insulating layer 170 may include the pixel electrode 181 of the organic light-emitting diode OLED. In an implementation, the pixel electrode 181 may be connected to the drain electrode DE through a via plug that penetrates through the third insulating layer 170. In an implementation, according to design of each pixel PX, the pixel electrode 181 may be connected to the source electrode SE. When the pixel electrode 181 has a light transmission property according to pixel design, the third conductive layer 180 may include a transparent or semi-transparent electrode layer including at least one conductive material, e.g., indium tin oxide (ITO), indium zinc oxide (IZO), zinc oxide (ZnO), indium oxide ($In_2O_3$), indium gallium oxide (IGO), or aluminum zinc oxide (AZO). When the pixel electrode 181 should have a light transmission property according to pixel design, the third conductive layer 180 may include a reflection layer including a material, e.g., silver (Ag), magnesium (Mg), aluminum (Al), platinum (Pt), palladium (Pd), gold (Au), nickel (Ni), neodymium (Nd), iridium (Ir), chromium (Cr), or a compound thereof. The third conductive layer 180 may further include a transparent or semi-transparent electrode layer on the reflection layer.

The pixel defining layer 190 on the third conductive layer 180 may expose at least a portion of the pixel electrode 181. The pixel defining layer 190 may include at least one organic insulating material, e.g., polyimide, polyamide, acryl resin, BCB, or a phenolic resin.

The intermediate layer 195 may be disposed on the pixel electrode 181 exposed via the pixel defining layer 190. The intermediate layer 195 may include an emissive layer including a fluorescent or phosphorescent material that emits red, green, blue, or white light. The emissive layer may be formed of, e.g., a low-molecular weight organic material or a high-molecular weight organic material.

In an implementation, the intermediate layer 195 may further include one or more functional layers, e.g., a hole transport layer (HTL), an hole injection layer (HIL), an electron transport layer (ETL), and an electron injection layer (EIL), below or above the emissive layer.

The common electrode 200 may be a transparent electrode. For example, the common electrode 200 may be a transparent or semi-transparent electrode, and may include a metal thin film including lithium (Li), calcium (Ca), fluorinated Li/Ca (LiF/Ca), LiF/Al, Al, Ag, Mg, and a compound thereof. A transparent conductive oxide (TCO) layer including, e.g., ITO, IZO, ZnO, or $In_2O_3$, may be further disposed on the metal thin film.

The thin film encapsulation layer 210 may block external moisture and/or oxygen and may encapsulate the organic light-emitting diode OLED and the thin film transistor TFT. The thin film encapsulation layer 210 may include a single layer or a plurality of layers. In an implementation, the thin film encapsulation layer 210 may include a plurality of layers, as illustrated in FIG. 3, or the thin film encapsulation layer 210 may include a single layer.

In an implementation, the thin film encapsulation layer 210 may include at least one inorganic layer and at least one organic layer, and the at least one inorganic layer and the at least one organic layer may be stacked on one another by alternating with each other. For example, the thin film encapsulation layer 210 may include inorganic layers 211 and 213 and an organic layer 212 between the inorganic layers 211 and 213. The inorganic layers 211 and 213 may include at least one material selected from silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride (SiON). The organic layer 212 may include, for example, polymethyl methacrylate (PMMA), polycarbonate (PC), polystyrene (PS), acryl-based resin, epoxy-based resin, polyimide, and polyethylene.

Figure 4A:
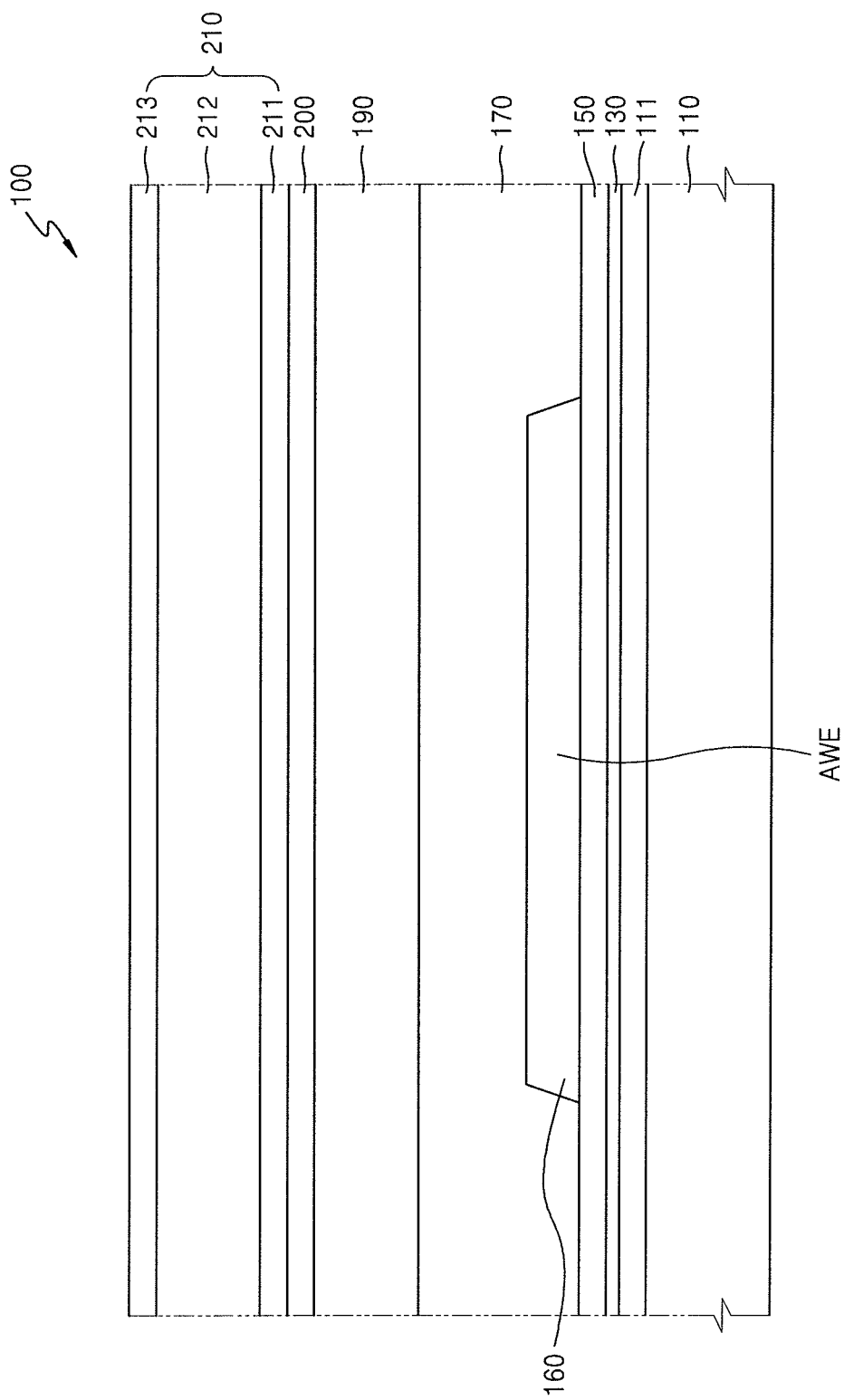
FIG. 4A illustrates a schematic cross-sectional view of the display panel taken along line IV-IV of FIG. 1.

FIG. 4A illustrates a schematic cross-sectional view of the display panel 100 taken along line IV-IV of FIG. 1.

Referring to FIGS. 1 and 4A, the auxiliary wiring AW may extend in the second direction D2, on the intermediate non-display region NDAb. The auxiliary wiring AW may be connected to the second voltage wiring VW2.

The auxiliary wiring AW may include an auxiliary wiring electrode AWE. The auxiliary wiring electrode AWE may be included in the second conductive layer 160 (e.g., may be continuous with, may extend from, or may be a part of the second conductive layer 160). For example, the auxiliary wiring electrode AWE may be formed of the same material as the source electrode SE of FIG. 3 and the drain electrode DE of FIG. 3 by using the same process of forming the source electrode SE and the drain electrode DE.

In an implementation, an opening that exposes at least a portion of the upper surface of the auxiliary wiring electrode AWE may be formed in the third insulating layer 170 and the pixel defining layer 190, and the common electrode 200 may be connected to the upper surface of the auxiliary wiring electrode AWE via the opening.

Figure 4B:
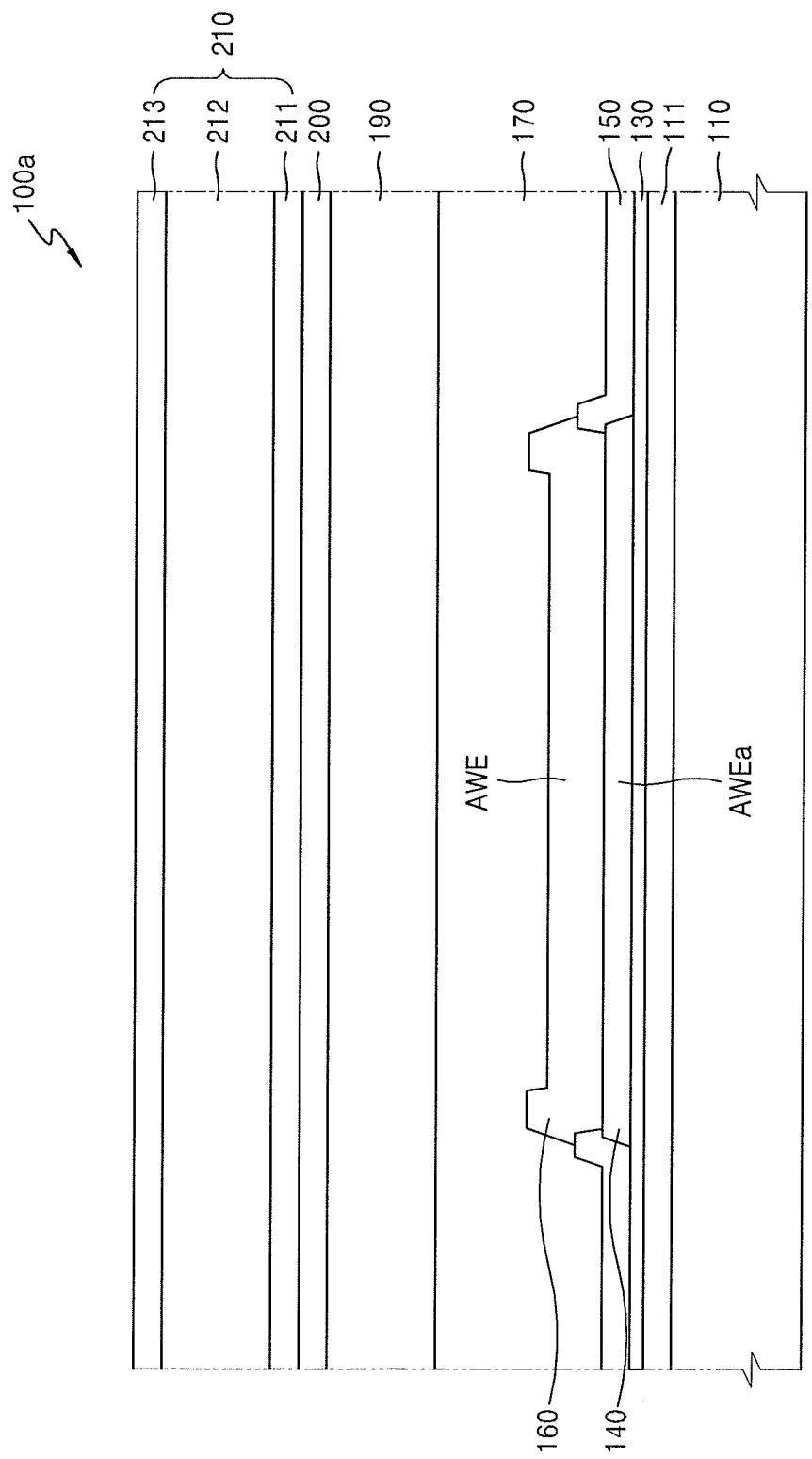
FIG. 4B illustrates a schematic cross-sectional view of a display panel taken along line IV-IV of FIG. 1, according to another embodiment.

FIG. 4B illustrates a schematic cross-sectional view of a display panel 100a taken along line IV-IV of FIG. 1, according to another embodiment.

Referring to FIG. 4B, the display panel 100a may include an auxiliary wiring electrode AWE, and a lower auxiliary wiring electrode AWEa that is below the auxiliary wiring electrode AWE and directly contacts the auxiliary wiring electrode AWE. The auxiliary wiring electrode AWE may be included in the second conductive layer 160 (e.g., may be continuous with, may extend from, or may be a part of the second conductive layer 160). The lower auxiliary wiring electrode AWEa may be included in the first conductive layer 140 (e.g., may be continuous with, may extend from, or may be a part of the first conductive layer 140). For example, the lower auxiliary wiring electrode AWEa may be formed of the same material as the gate electrode GE of FIG. 3 by using the same process of forming the gate electrode GE. The auxiliary wiring electrode AWE and the lower auxiliary wiring electrode AWEa may constitute the auxiliary wiring AW of FIG. 1.

In an implementation, an opening that exposes at least a portion of the upper surface of the auxiliary wiring electrode AWE may be formed in the third insulating layer 170 and the pixel defining layer 190, and the common electrode 200 may be connected to the upper surface of the auxiliary wiring electrode AWE via the opening.

FIG. 4C illustrates a schematic cross-sectional view of a display panel 100b taken along line IV-IV of FIG. 1, according to another embodiment.

Referring to FIG. 4C, the display panel 100b may include an auxiliary wiring electrode AWE, and an upper auxiliary wiring electrode AWEb that is above the auxiliary wiring electrode AWE and directly contacts the auxiliary wiring electrode AWE. The auxiliary wiring electrode AWE may be included in the second conductive layer 160 (e.g., may be continuous with, may extend from, or may be a part of the second conductive layer 160). The upper auxiliary wiring electrode AWEb may be included in the third conductive layer 180 (e.g., may be continuous with, may extend from, or may be a part of the third conductive layer 180). For example, the upper auxiliary wiring electrode AWEb may be formed of the same material as the pixel electrode 181 of FIG. 3 by using the same process of forming the pixel electrode 181. The auxiliary wiring electrode AWE and the upper auxiliary wiring electrode AWEb may constitute the auxiliary wiring AW of FIG. 1.

In an implementation, an opening that exposes at least a portion of the upper surface of the upper auxiliary wiring electrode AWEb may be formed in the pixel defining layer 190, and the common electrode 200 may be connected to the upper surface of the upper auxiliary wiring electrode AWEb via the opening.

Figure 4D:
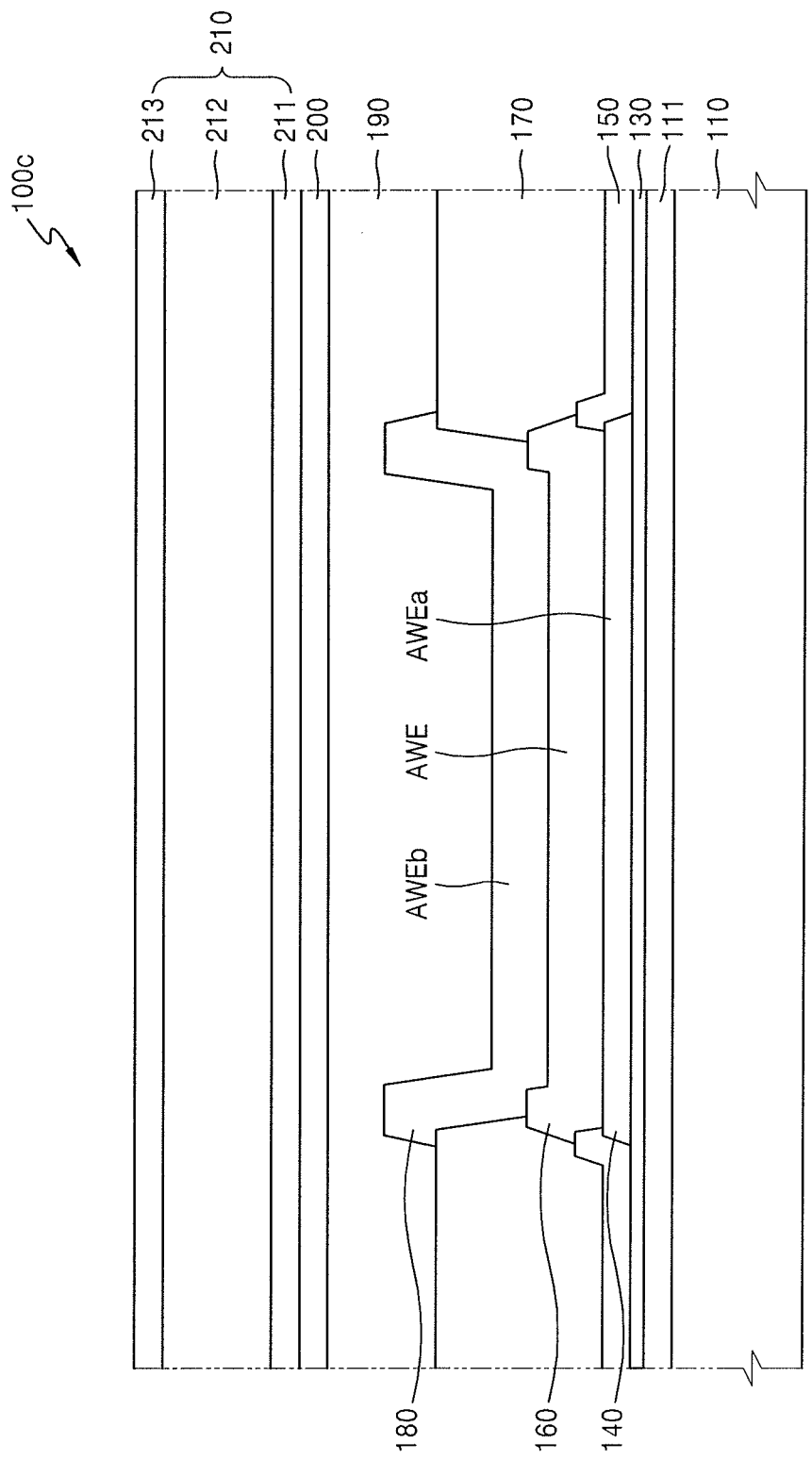
FIG. 4D illustrates a schematic cross-sectional view of a display panel taken along line IV-IV of FIG. 1, according to another embodiment.

FIG. 4D illustrates a schematic cross-sectional view of a display panel 100c taken along line IV-IV of FIG. 1, according to another embodiment.

Referring to FIG. 4D, the display panel 100c may include an auxiliary wiring electrode AWE, a lower auxiliary wiring electrode AWEa that is below the auxiliary wiring electrode AWE and directly contacts the auxiliary wiring electrode AWE, and an upper auxiliary wiring electrode AWEb that is above the auxiliary wiring electrode AWE and directly contacts the auxiliary wiring electrode AWE. The auxiliary wiring electrode AWE may be included in the second conductive layer 160 (e.g., may be continuous with, may extend from, or may be a part of the second conductive layer 160). The lower auxiliary wiring electrode AWEa may be included in the first conductive layer 140 (e.g., may be continuous with, may extend from, or may be a part of the first conductive layer 140). The upper auxiliary wiring electrode AWEb may be included in the third conductive layer 180 (e.g., may be continuous with, may extend from, or may be a part of the third conductive layer 180). The auxiliary wiring electrode AWE, the lower auxiliary wiring electrode AWEa, and the upper auxiliary wiring electrode AWEb may constitute the auxiliary wiring AW of FIG. 1.

In an implementation, an opening that exposes at least a portion of the upper surface of the upper auxiliary wiring electrode AWEb may be formed in the pixel defining layer 190, and the common electrode 200 may be connected to the upper surface of the upper auxiliary wiring electrode AWEb via the opening.

Figure 5:
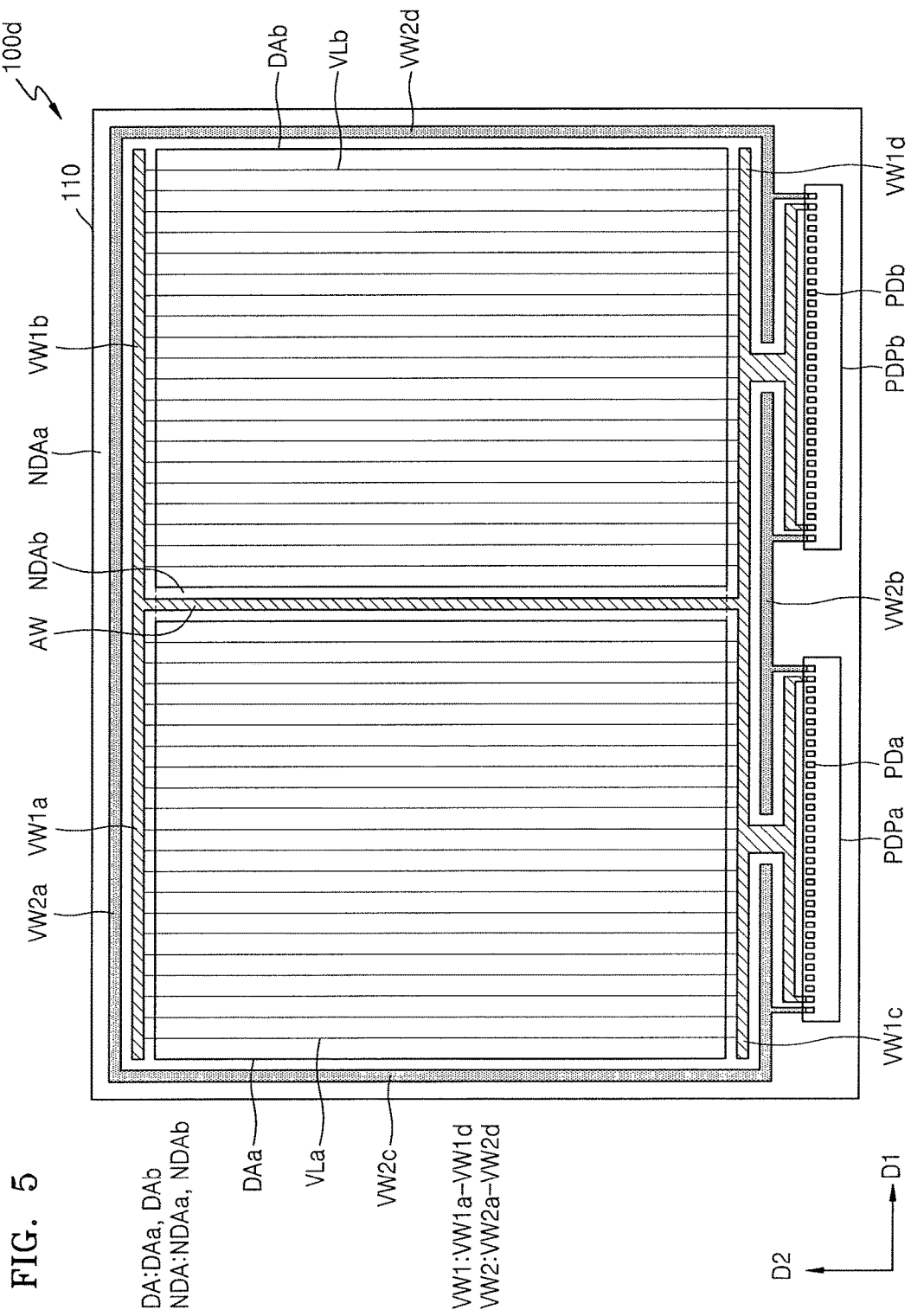
FIG. 5 illustrates a schematic plan view of a display panel according to another embodiment.

FIG. 5 illustrates a schematic plan view of a display panel 100d according to another embodiment.

Referring to FIG. 5, the display panel 100d may include a substrate 110 in which a display region DA and a non-display region NDA are defined, pixels PX (see FIG. 2), first and second voltage wirings VW1 and VW2, and an auxiliary wiring AW connected to the first voltage wiring VW1. Differences between the display panels 100 and 100d will now be focused on and described, and substantially the same components of FIG. 5 as those of FIG. 1 may not be repeated herein.

The auxiliary wiring AW connected to the first voltage wiring VW1 may be on the intermediate non-display region NDAb. The auxiliary wiring AW may be directly connected to the first voltage wiring VW1 and may be simultaneously and integrally formed with the first voltage wiring VW1 (e.g., the auxiliary wiring AW may be continuous with the first voltage wiring VW1).

The first portion VW1a and the second portion VW1b of the first voltage wiring VW1 may be connected to a first end of the auxiliary wiring AW, and the third portion VW1c and the fourth portion VW1d of the first voltage wiring VW1 may be connected to a second end of the auxiliary wiring AW. The first portion VW1a and the second portion VW1b of the first voltage wiring VW1 may be collectively referred to as a first portion that is directly connected to the first end of the auxiliary wiring AW and extends in a first direction on the edge non-display region NDAa, and the third portion VW1c and the fourth portion VW1d of the first voltage wiring VW1 may be collectively referred to as a second portion that is directly connected to the second end of the auxiliary wiring AW and extends in the first direction on the edge non-display region NDAa.

If no auxiliary wirings AW (connected to the first voltage wiring VW1) were to be included, the pixels PX on the upper portion of the display region DA could emit light darkly, e.g., with a relatively lower brightness, due to a voltage drop. According to an embodiment, the first portion VW1a and the second portion VW1b of the first voltage wiring VW1 may be connected to the third portion VW1c and the fourth portion VW1d, to which the first driving voltage ELVDD is applied, via the auxiliary wiring AW having relatively low resistance, a voltage having substantially the same voltage level as the first driving voltage ELVDD may also be applied to the pixels PX on the upper portion of the display region DA, and the pixels PX on the upper portion of the display region DA may also emit light brightly. Accordingly, brightness uniformity may improve, and a display quality may also improve.

Figure 6:
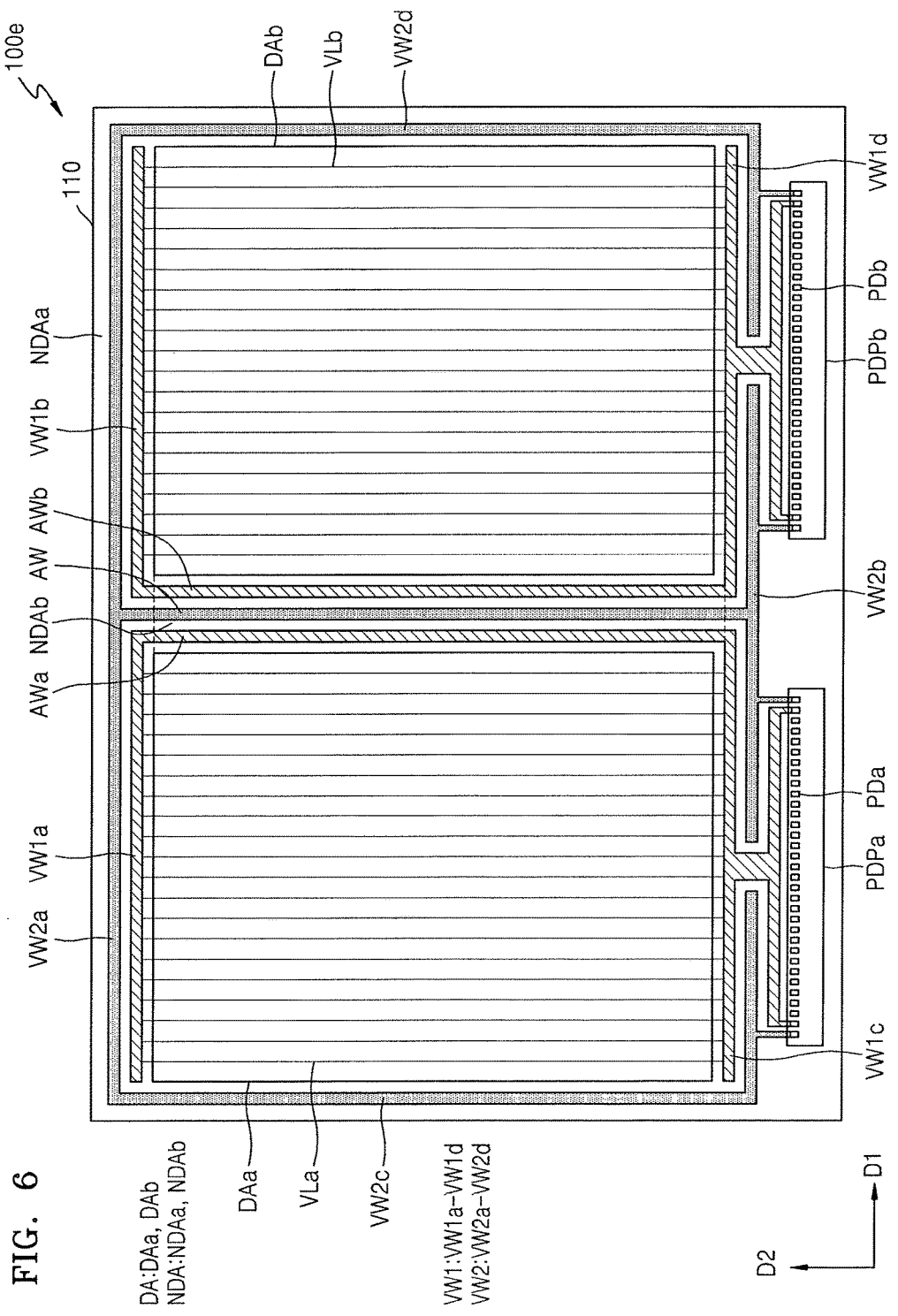
FIG. 6 illustrates a schematic plan view of a display panel according to another embodiment.

FIG. 6 illustrates a schematic plan view of a display panel 100e according to another embodiment.

Referring to FIG. 6, the display panel 100e may include a substrate 110 in which a display region DA and a non-display region NDA are defined, pixels PX (see FIG. 2), first and second voltage wirings VW1 and VW2, an auxiliary wiring AW connected to the second voltage wiring VW2, and a pair of sub auxiliary wirings, e.g., first and second sub auxiliary wirings AWa and AWb, connected to the first voltage wiring VW1.

The auxiliary wiring AW connected to the second voltage wiring VW2 may be on the intermediate non-display region NDAb. The auxiliary wiring AW may be directly connected to the second voltage wiring VW2 and may be simultaneously and integrally formed with the second voltage wiring VW2.

On the intermediate non-display region NDAb, the first sub auxiliary wiring AWa may extend in the second direction D2 to connect the first portion VW1a and the third portion VW1c of the first voltage wiring VW1 to each other, and the second sub auxiliary wiring AWb may extend in the second direction D2 to connect the second portion VW1b and the fourth portion VW1d of the first voltage wiring VW1 to each other. The auxiliary wiring AW may be disposed between the first sub auxiliary wiring AWa and the second sub auxiliary wiring AWb.

The first sub auxiliary wiring Awa may be directly connected between an end of the first portion VW1a and an end of the third portion VW1c, and the second sub auxiliary wiring AWb may be directly connected between an end of the second portion VW1b and an end of the fourth portion VW1d. The first sub auxiliary wiring AWa and the second sub auxiliary wiring AWb may be simultaneously and integrally formed with the first voltage wiring VW1. In this respect, the first sub auxiliary wiring AWa and the second sub auxiliary wiring AWb may be respectively referred to as first and second portions of the first voltage wiring VW1 that completely cross between the first and second display regions DAa and DAb on the intermediate non-display region NDAb.

Widths of the first sub auxiliary wiring AWa and the second sub auxiliary wiring AWb in the first direction D1 may be equal to or lower than a half of a width of the auxiliary wiring AW in the first direction D1.

In an implementation, the auxiliary wiring AW may be connected to the first voltage wiring VW1, and the first sub auxiliary wiring AWa and the second sub auxiliary wiring AWb may be connected to the second voltage wiring VW2.

The auxiliary wiring AW connected to the second voltage wiring VW2 may be directly connected to the common electrode 200. As described above, if no auxiliary wirings AW were to be included, the pixels PX located on the center of the display panel 100e could emit light having a relatively lower brightness due to a voltage drop. However, a voltage having the same level as the second driving voltage ELVSS may also be applied to the pixels PX located on the center of the display panel 100e due to the auxiliary wiring AW passing through the center of the display panel 100e, and the pixels PX located on the center of the display panel 100e may also emit light brightly. Accordingly, brightness uniformity may improve, and accordingly, a display quality may also improve.

The first sub auxiliary wiring AWa may connect the first portion VW1a of the first voltage wiring VW1 to the third portion VW1c thereof, and the second sub auxiliary wiring AWb may connect the second portion VW1b of the first voltage wiring VW1 to the fourth portion VW1d thereof.

If no first and second sub auxiliary wirings AWa and AWb were to be included, the pixels PX on the upper portion of the display region DA could emit light having a relatively lower brightness due to a voltage drop. According to an embodiment, the first portion VW1a and the second portion VW1b of the first voltage wiring VW1 may be connected to the third portion VW1c and the fourth portion VW1d thereof, to which the first driving voltage ELVDD is applied, via the first and second sub auxiliary wiring AWa and AWb having relatively low resistance, a voltage having substantially the same voltage level as the first driving voltage ELVDD may also be applied to the pixels PX on the upper portion of the display region DA, and the pixels PX on the upper portion of the display region DA may also emit light brightly. Accordingly, brightness uniformity may improve, and accordingly, a display quality may also improve.

Figure 7:
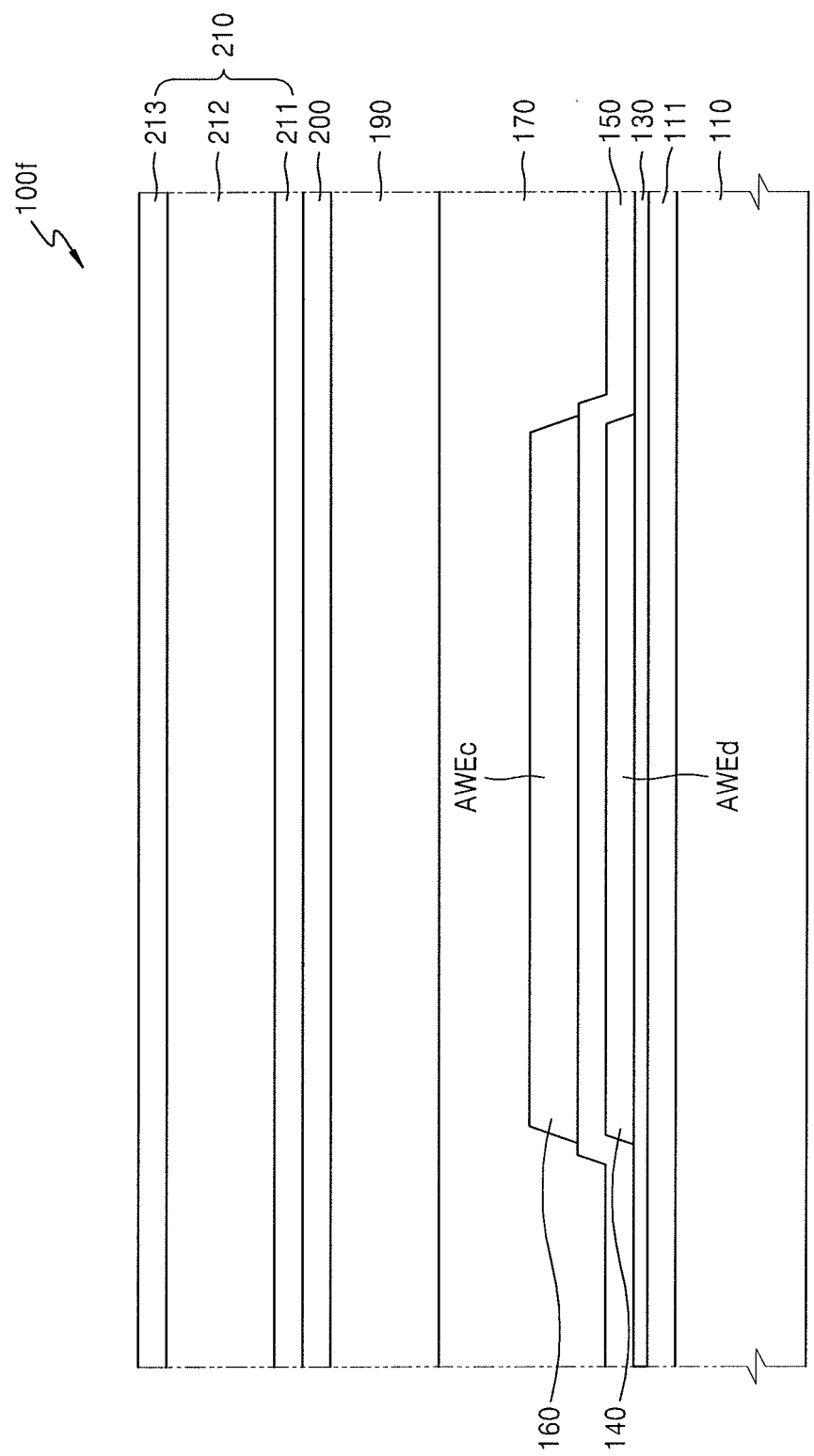
FIG. 7 illustrates a schematic cross-sectional view of a display panel taken along line IV-IV of FIG. 1, according to another embodiment.

FIG. 7 illustrates a schematic cross-sectional view of a display panel 100f taken along line IV-IV of FIG. 1, according to another embodiment.

Referring to FIG. 7, the display panel 100f may include a first auxiliary wiring electrode AWEc and a second auxiliary wiring electrode AWEd.

The first auxiliary wiring electrode AWEc may be connected to the second voltage wiring VW2, on the edge non-display region NDAa. The first auxiliary wiring electrode AWEc may directly connect the first portion VW2a and the second portion VW2b of the second voltage wiring VW2 to each other, like the auxiliary wiring AW of FIG. 1. The first auxiliary wiring electrode AWEc may be included in the second conductive layer 160. For example, the first auxiliary wiring electrode AWEc may be formed of the same material as the source electrode SE of FIG. 3 and the drain electrode DE of FIG. 3 by using the same process of forming the source electrode SE and the drain electrode DE.

The second auxiliary wiring electrode AWEd may be connected to the first voltage wiring VW1, on the edge non-display region NDAa. The second auxiliary wiring electrode AWEd may directly connect the third portion VW1c and the fourth portion VW1d of the first voltage wiring VW1 to the first portion VW1a and the second portion VW1b of the first voltage wiring VW1, like the auxiliary wiring AW of FIG. 5. The second auxiliary wiring electrode AWEd may be included in the second conductive layer 140. For example, the second auxiliary wiring electrode AWEd may be formed of the same material as the gate electrode GE of FIG. 3 by using the same process of forming the gate electrode GE.

According to another embodiment, an opening that exposes at least a portion of the upper surface of the first auxiliary wiring electrode AWEc may be formed in the third insulating layer 170 and the pixel defining layer 190, and the common electrode 200 may be connected to the upper surface of the first auxiliary wiring electrode AWEc via the opening.

If the first auxiliary wiring electrodes AWEc were to be omitted, the pixels PX located on the center of the display panel 100f could emit light having a relatively lower brightness due to a voltage drop. According to an embodiment, the first auxiliary wiring electrode AWEc may pass through the center of the display panel 100f and thus a voltage having the same level as the second driving voltage ELVSS may also be applied to the pixels PX located on the center of the display panel 100f, the pixels PX located on the center of the display panel 100f may also emit light brightly.

If the second auxiliary wiring electrodes AWEd were to be omitted, the pixels PX on the upper portion of the display region DA could emit light having a relatively lower brightness due to a voltage drop. According to an embodiment, the first portion VW1a and the second portion VW1b of the first voltage wiring VW1 are connected to the third portion VW1c and the fourth portion VW1d thereof, to which the first driving voltage ELVDD is applied, via the second auxiliary wiring electrode AWEd, a voltage having substantially the same voltage level as the first driving voltage ELVDD may also be applied to the pixels PX on the upper portion of the display region DA, and the pixels PX on the upper portion of the display region DA may also emit light brightly. Accordingly, brightness uniformity may improve, and accordingly, a display quality may also improve.

Figure 8:
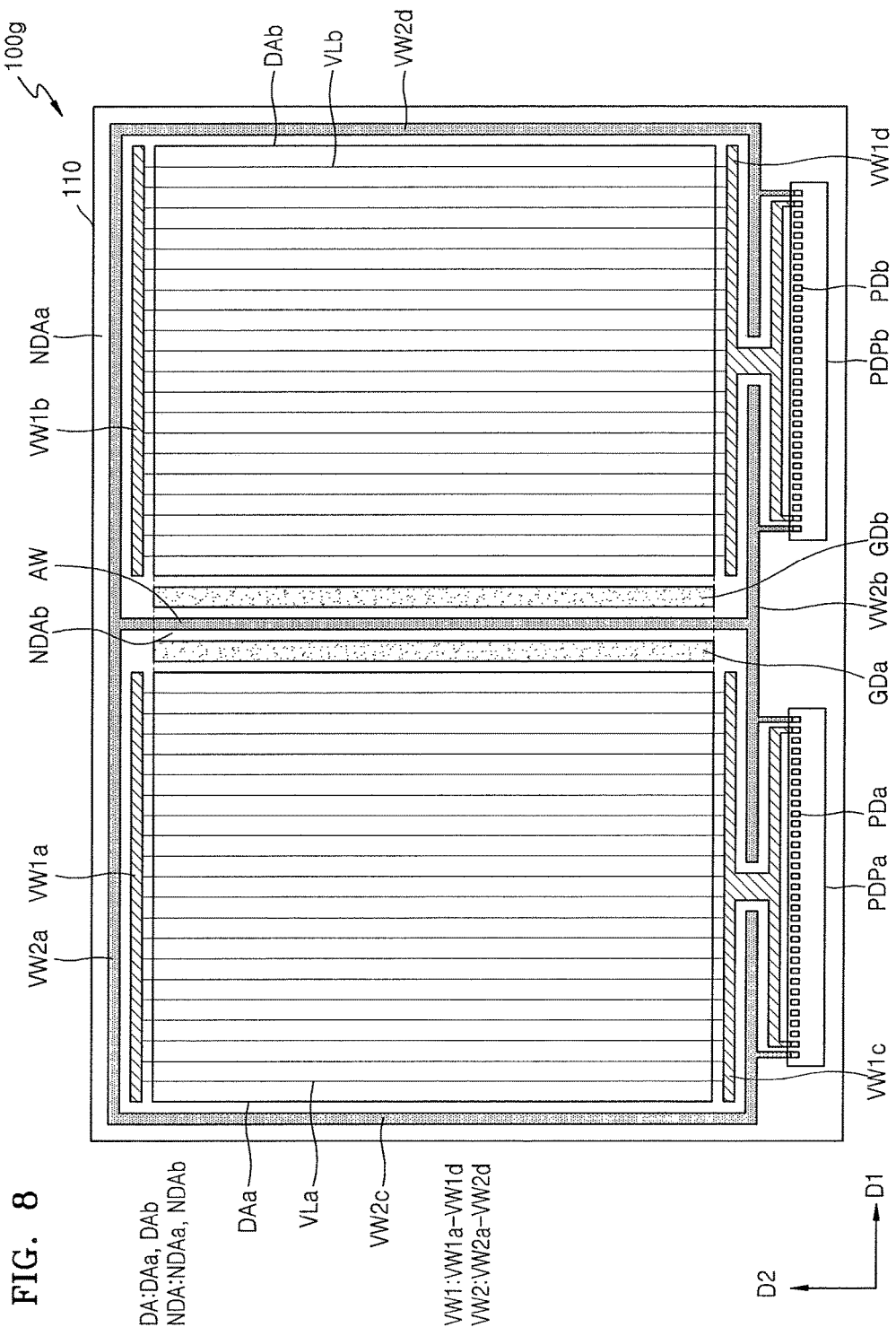
FIG. 8 illustrates a schematic plan view of a display panel according to another embodiment.

FIG. 8 is a schematic plan view of a display panel 100g according to another embodiment.

Referring to FIG. 8, the display panel 100g may include a substrate 110 in which first and second display regions DAa and DAb and a non-display region NDA are defined, pixels PX (see FIG. 2), first and second voltage wirings VW1 and VW2, an auxiliary wiring AW connected to the second voltage wiring VW2, and first and second gate driving circuits GDa and GDb that drive the gate lines of FIG. 2 on the first and second display regions DAa and Dab, respectively.

As described above, the gate lines GL on the first display region DAa may be referred to as first gate lines, and the gate lines GL on the second display region DAb may be referred to as second gate lines.

The auxiliary wiring AW connected to the second voltage wiring VW2 may be on the intermediate non-display region NDAb. The auxiliary wiring AW may be directly connected to the second voltage wiring VW2 and may be simultaneously and integrally formed with the second voltage wiring VW2. According to another embodiment, the auxiliary wiring AW may be directly connected to the first voltage wiring VW1.

The first gate driving circuit GDa is disposed between the first display region DAa and the auxiliary wiring AW on the intermediate non-display region NDAa, and drives the gate lines GL on the first display region DAa. The first gate driving circuit GDa provides control signals including a scan signal to the pixels PX on the first display region DAa via the gate lines GL on the first display region DAa at a pre-set timing.

The second gate driving circuit GDb may be disposed between the second display region DAb and the auxiliary wiring AW on the intermediate non-display region NDAa, and drives the gate lines GL on the second display region DAb. The second gate driving circuit GDb may provide control signals including a scan signal to the pixels PX on the second display region DAb via the gate lines GL on the second display region DAb at a pre-set timing.

If the auxiliary wirings AW were to be omitted, the pixels PX located on the center of the display panel 100g could emit light having a relatively lower brightness due to a voltage drop. According to an embodiment, a voltage having the same level as the second driving voltage ELVSS may also be applied to the pixels PX located on the center of the display panel 100g due to the auxiliary wiring AW passing through the center of the display panel 100g, and the pixels PX located on the center of the display panel 100e may also emit light brightly. Accordingly, brightness uniformity may improve, and accordingly, a display quality may also improve.

When the first gate driving circuit GDa and the second gate driving circuit GDb are disposed on the edge non-display region NDAa, the width of the edge non-display region NDAa may increase. However, according to the present embodiment, the first gate driving circuit GDa and the second gate driving circuit GDb may be between the first and second display regions DAa and DAb on the intermediate non-display region NDAb, an edge portion of the display panel 100g, which displays no images, and may become thinner.

Figure 9:
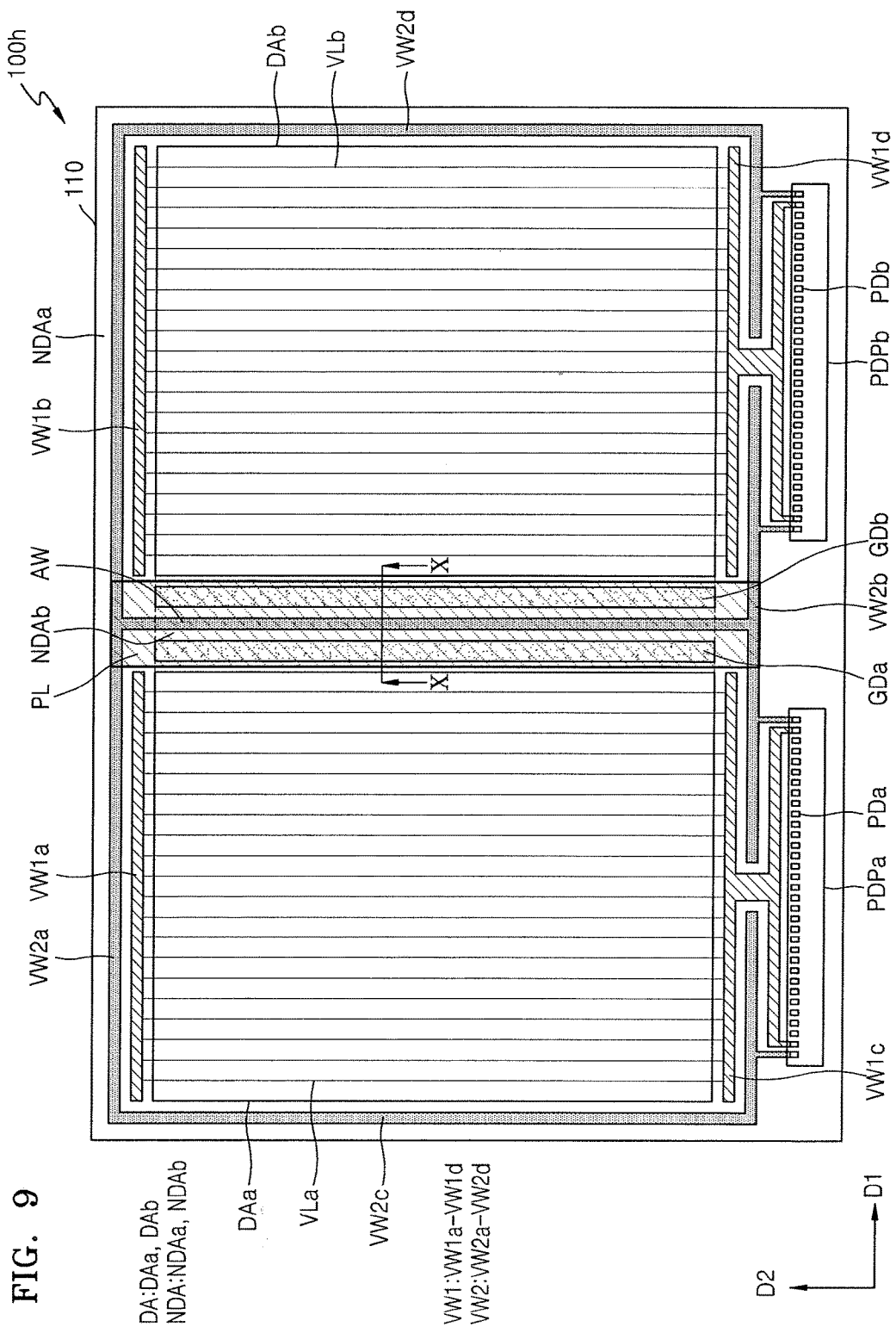
FIG. 9 illustrates a schematic plan view of a display panel according to another embodiment.
Figure 10:
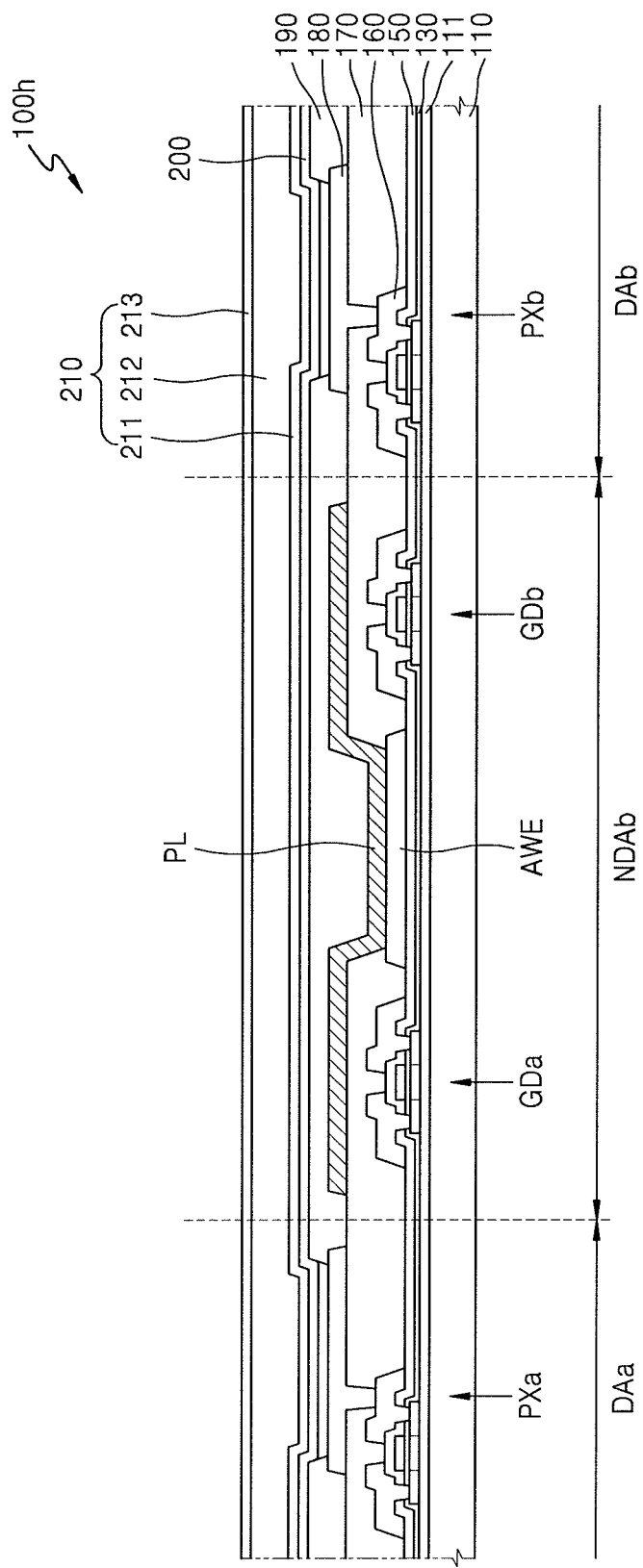
FIG. 10 illustrates a schematic cross-sectional view of the display panel along line IV-IV of FIG. 9.

FIG. 9 illustrates a schematic plan view of a display panel 100h according to another embodiment. FIG. 10 illustrates a schematic cross-sectional view of the display panel 100h taken along line IV-IV of FIG. 9.

Referring to FIG. 9, the display panel 100h includes a substrate 110 in which first and second display regions DAa and DAb and a non-display region NDA are defined, pixels PX (see FIG. 2), first and second voltage wirings VW1 and VW2, an auxiliary wiring AW connected to the second voltage wiring VW2, first and second gate driving circuits GDa and GDb that drive the gate lines of FIG. 2 on the first and second display regions DAa and Dab, respectively, and a protection layer PL. The display panel 100h is substantially the same as the display panel 100g of FIG. 8 except for the protection layer PL, and a repeated description thereof may be omitted.

The protection layer PL may be directly connected to the auxiliary wiring AW, and may cover the first and second gate driving circuits GDa and GDb on the intermediate non-display region NDAb. The protection layer PL may be included in the third conductive layer 180. For example, the protection layer PL may be formed of the same material as the pixel electrode 181 of FIG. 3 by using the same process of forming the pixel electrode 181.

As shown in FIG. 10, a first pixel PXa may be disposed on the first display region DAa, and a second pixel PXb may be disposed on the second display region DAb. On the intermediate non-display region NDAb between the first display region DAa and the second display region DAb, the first gate driving circuit GDa may include at least one thin film transistor and the second gate driving circuit GDb may include at least one thin film transistor. On the intermediate non-display region NDAb, an auxiliary wiring electrode AWE (serving as the auxiliary wiring AW of FIG. 8) may be disposed between the first gate driving circuit GDa and the second gate driving circuit GDb.

An opening that exposes at least a portion of the upper surface of the auxiliary wiring electrode AWE may be formed in the third insulating layer 170, and the protection layer PL may be connected to the upper surface of the auxiliary wiring electrode AWE via the opening. The auxiliary wiring electrode AWE may be connected to the second voltage wiring VW2, and thus the second driving voltage ELVSS may be applied to the auxiliary wiring electrode AWE. The protection layer PL may also be formed of a conductive material, and the second driving voltage ELVSS may also be applied to the protection layer PL. Accordingly, the probability that the first gate driving circuit GDa and the second gate driving circuit GDb below the protection layer PL malfunctions due to an external factor, such as static electricity, may be reduced. Thus, reliabilities of the first gate driving circuit GDa and the second gate driving circuit GDb may improve, and a display quality may also improve.

Figure 11:
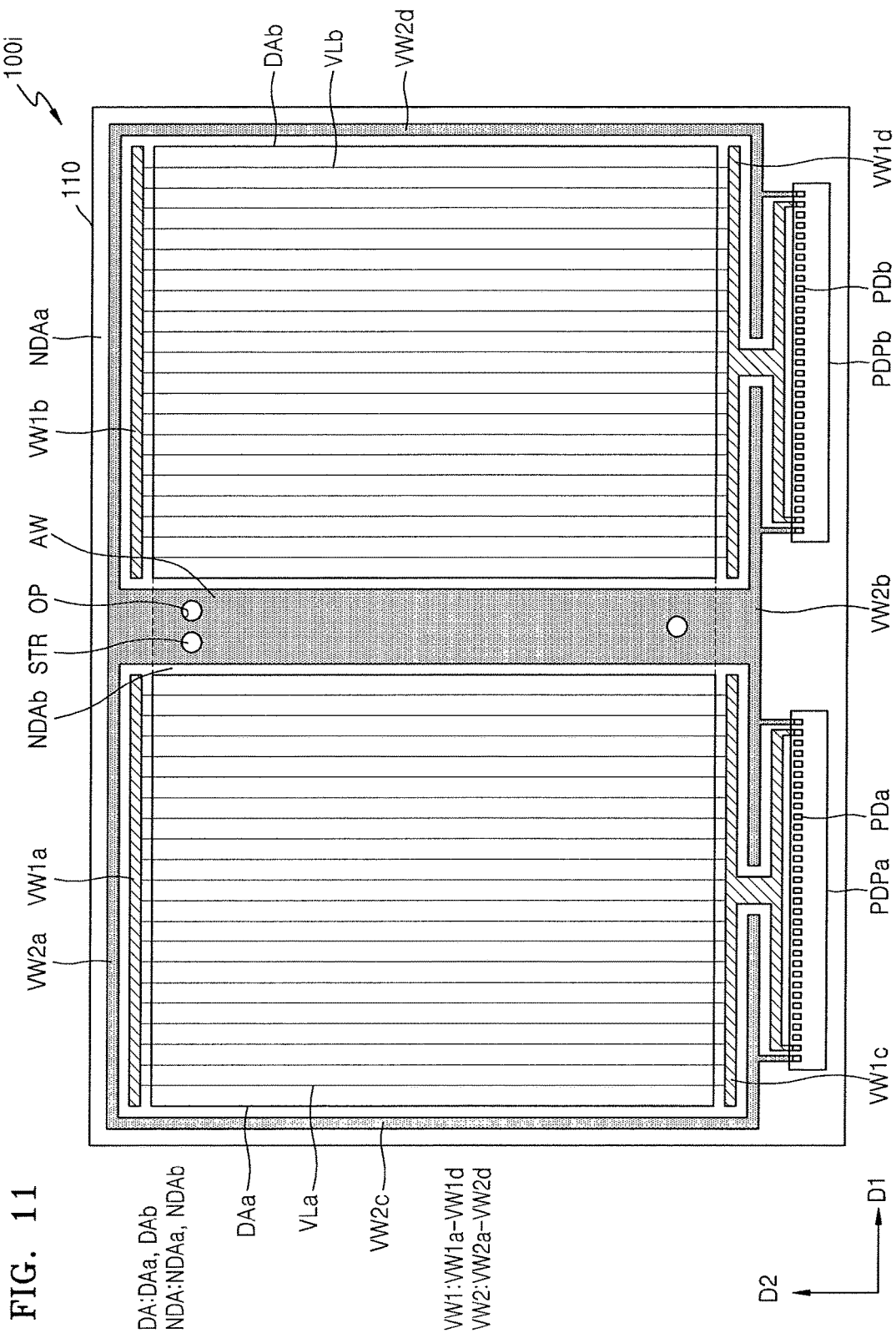
FIG. 11 illustrates a schematic plan view of a display panel according to another embodiment.

FIG. 11 illustrates a schematic plan view of a display panel 100i according to another embodiment.

Referring to FIG. 11, the display panel 100i may include a substrate 110 in which first and second display regions DAa and DAb and a non-display region NDA are defined, pixels PX (see FIG. 2), first and second voltage wirings VW1 and VW2, and an auxiliary wiring AW connected to the second voltage wiring VW2.

The auxiliary wiring AW connected to the second voltage wiring VW2 may be on the intermediate non-display region NDAb. The auxiliary wiring AW may be directly connected to the second voltage wiring VW2 and may be simultaneously and integrally formed with the second voltage wiring VW2. According to another embodiment, the auxiliary wiring AW may be directly connected to the first voltage wiring VW1.

At least one see-through or transparent region STR located within the intermediate non-display region NDAb may be defined in the substrate 110. At least one opening OP corresponding to the at least one transparent region STR may be formed in the auxiliary wiring AW. An opaque material may be deposited on the transparent region STR of the substrate 110. Accordingly, light may pass through the transparent region STR without blockage or interference.

A plurality of openings OP may be arranged in the first direction D1 within the auxiliary wiring AW, and only one opening OP may be located at the center of the auxiliary wiring AW.

Light may pass through the transparent region STR, and various sensors that use light may be disposed on one surface of the substrate 110 so as to overlap the transparent region STR, and may sense light on the opposite side to the surface of the substrate 110 on which the sensors are disposed. An image acquisition device may overlap the transparent region STR, and may acquire an image on the opposite side to the substrate 110 via the transparent region STR.

When the display panel 100i is used in a head mounted display apparatus, an apparatus for sensing a pupil location or an eye blink may be disposed to overlap the transparent region STR, and may sense a pupil location or an eye blink of a user. If the transparent region STR were to be omitted, a sensing apparatus may be included outside a display panel, and thus accurate sensing could be difficult and a display apparatus could be enlarged.

Figure 12:
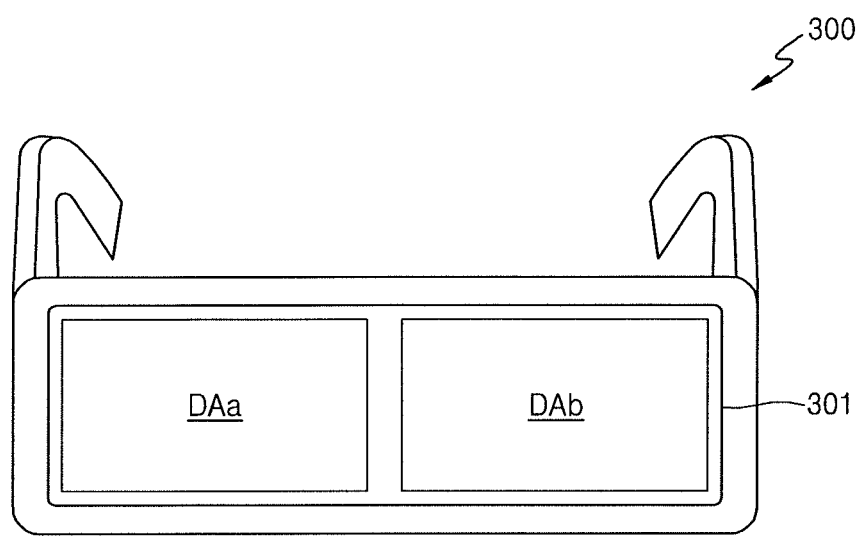
FIG. 12 illustrates an example in which any of display panels according to various embodiments is implemented in a head mounted display apparatus.

FIG. 12 illustrates an example in which any of display panels according to various embodiments is implemented in a head mounted display apparatus 300.

Figure 13:
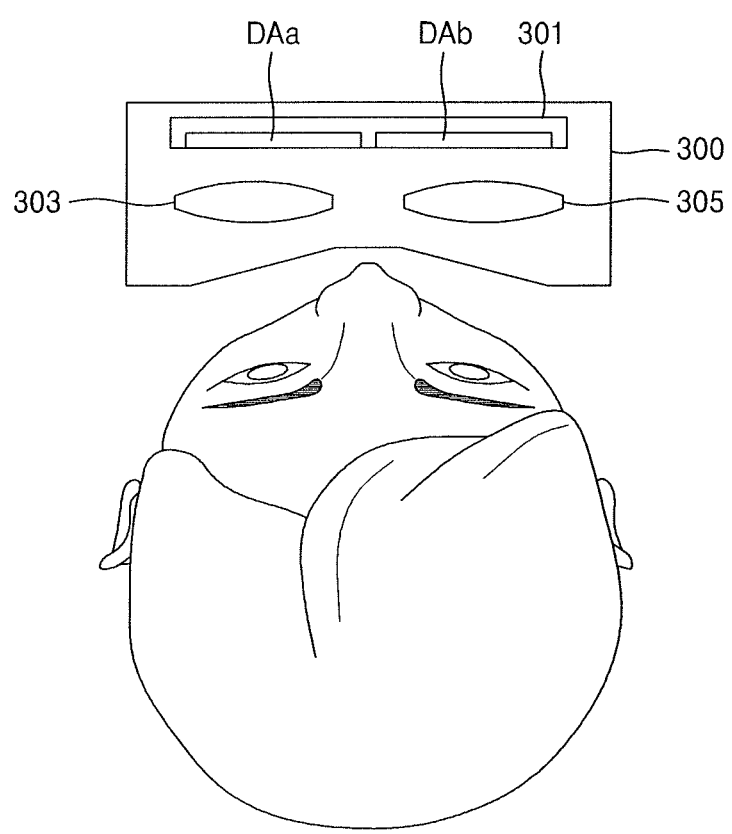
FIG. 13 illustrates a top view of a person who is wearing the head mounted display apparatus of FIG. 12.

FIG. 13 illustrates a top view of a person who is wearing the head mounted display apparatus 300 of FIG. 12.

Referring to FIGS. 12 and 13, the head mounted display apparatus 300 may include a display panel 301 including the first display region DAa and the second display region DAb. The display panel 301 may be one of the display panels 100 and 100a-100i according to various embodiments described above with reference to FIGS. 1-11, or an equivalent thereof.

The first display region DAa may display a left-eye image that is watched by the left eye, and the second display region DAb may display a right-eye image that is watched by the right eye. To help prevent a right-eye image from being seen by the left eye or a left-eye image from being seen by the right eye, the non-display region NDAb may be between the first display region DAa and the second display region DAb. The auxiliary wiring AW may be disposed on the non-display region NDAb in order to help increase the quality of a display image.

The head mounted display apparatus 300 may include a left-eye optical system 303 disposed in front of the first display region DAa, and a right-eye optical system 305 disposed in front of the second display region DAb.

The head mounted display apparatus 300 may be mounted on the head or face of the user. For example, as shown in FIG. 12, the head mounted display apparatus 300 may be mounted on the face by using the temples of eyeglasses, like eyeglasses. The head mounted display apparatus 300 may be worn on the head in the form of a helmet, or may be fixed in front of the face by using a band or the like.

Figure 14:
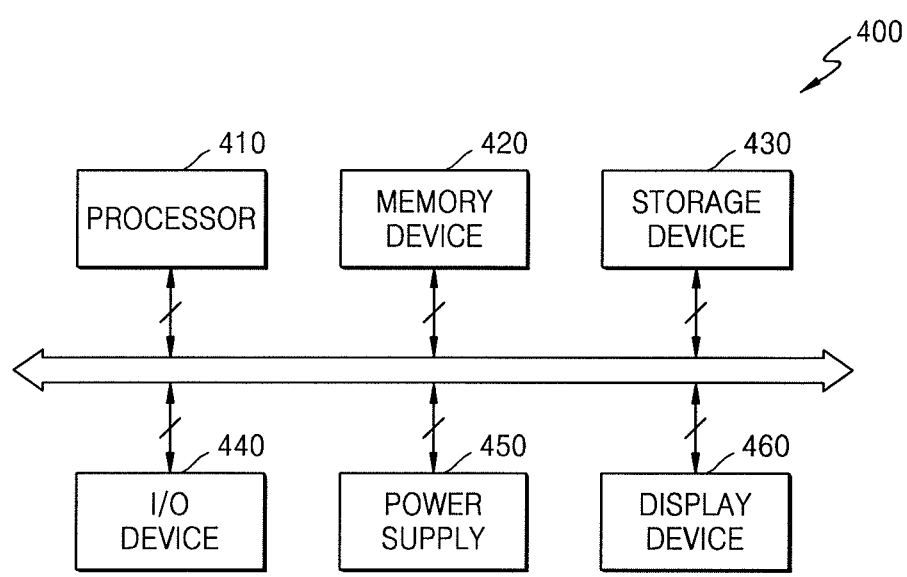
FIG. 14 illustrates a block diagram of an electronic apparatus including any of display panels according to various embodiments.

FIG. 14 illustrates a block diagram of an electronic apparatus 400 including any of display panels according to various embodiments.

Referring to FIG. 14, the electronic apparatus 400 may include a processor 410, a memory device 420, a storage device 430, an input/output (I/O) device 440, a power supply 450, and a display device 460. The display device 460 may include one of the display panels 100 and 100a-100i according to various embodiments described above with reference to FIGS. 1-11, or an equivalent thereof. The electronic apparatus 400 may be the head mounted display apparatus 300 of FIGS. 12 and 13.

The electronic apparatus 400 may further include various ports which are capable of being connected to a peripheral device (e.g., a video card, a sound card, a memory card, and a universal serial bus (USB) device or communicating with other systems.

The processor 410 may execute specific calculations or specific tasks. The processor 410 may be a micro-processor, a central processing unit (CPU), or the like. The processor 410 may be connected to other components via an address bus, a control bus, a data bus, and the like. The processor 410 may be connected to an expansion bus, such as a peripheral component interconnect (PCI) bus. The processor 410 may process data that is received via a bus, according to a preset process. When the data that is received is image data, the processor 410 may provide image data to the display device 460 so that an image of the image data may be displayed.

The memory device 420 may store pieces of data necessary for operating the electronic apparatus 400. For example, the memory device 420 may include a non-volatile memory device (e.g., erasable programmable read-only memory (EPROM), electrically erasable programmable read-only memory (EEPROM), flash memory, phase change random access memory (PRAM), resistance random access memory (RRAM), nano-floating gate memory (NFGM), polymer random access memory (PoRAM), magnetic random access memory (MRAM), or ferroelectric random access memory (FRAM)) and/or a volatile memory device (e.g., dynamic random access memory (DRAM), static random access memory (SRAM), or a mobile DRAM).

The storage device 430 may include a solid state drive (SSD), a hard disk drive (HDD), a CD-ROM, and the like.

The I/O device 440 may include an input device (e.g., a keyboard, a keypad, a touch screen, or a mouse) and an output device (e.g., a speaker or a printer).

The display device 460 may be included in the I/O device 440.

The power supply 450 may provide power necessary for operating the electronic apparatus 400. The power supply 450 may provide, to the display device 460, voltages necessary for driving the display device 460, for example, the first driving voltage ELVDD and the second driving voltage ELVSS.

The display device 460 may display an image corresponding to the image data provided by the processor 410. The image data may include left-eye image data and right-eye image data. The first display region DAa of the display device 460 displays an image corresponding to the left-eye image data, and the second display region DAb of the display device 460 displays an image corresponding to the right-eye image data. The display device 460 may be connected to other components via buses or other communication links.

By way of summation and review, a pixel may express a grayscale by adjusting the brightness of a light-emitting device by using light-emission current having a magnitude that is determined according to a data voltage that is received via the data line. Due to resistance components of the voltage lines and currents flowing in the voltage lines, a voltage drop (IR drop) may occur in the voltage lines, and the pixels may be driven according to different levels of driving voltages according to locations of the pixels. Accordingly, even when the pixels receive the same levels of data voltages, the pixels may emit light with different levels of brightness due to different levels of driving voltages according to locations of the pixels. The organic light-emitting display apparatuses could display low-quality images.

Electronic apparatuses including a display panel located close to both eyes of a viewer, such as head-mounted displays, have been considered.

According to various embodiments, a voltage drop of a voltage line may be reduced using an intermediate non-display region between two display regions that displays no images. Accordingly, display panels according to embodiments and electronic apparatuses including the same may display a high-quality image. Furthermore, occurrence of an issue due to an external factor (e.g., static electricity) may be reduced by a protection layer included in any of the display panels. Various sensors may be provided on a rear surface of any of the display panels by using a transparent region, and a design freedom degree of the electronic apparatuses may be increased.

The embodiments may provide a display panel having two display regions.

The embodiments may provide a display panel having two display regions and including pixels that receive uniform levels of driving voltages.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display panel, comprising:
a substrate that includes a display region and a non-display region defined therein, the display region including a first display region and a second display region spaced apart from each other in a first direction, and the non-display region including an edge non-display region that surrounds the display region and an intermediate non-display region between the first display region and second display region;
a plurality of first pixels arranged on the first display region;
a plurality of second pixels arranged on the second display region;
a first voltage wiring and a second voltage wiring on the non-display region to transmit a first driving voltage and a second driving voltage to the first pixel and the second pixel, respectively; and
an auxiliary wiring extending in a second direction, which is perpendicular to the first direction, on the intermediate non-display region, the auxiliary wiring completely crossing between the first display region and the second display region, and being connected to one of the first voltage wiring and the second voltage wiring.

2. The display panel of claim 1, wherein an interval between the first display region and the second display region is greater than a width of each of the first pixels and second pixels in the first direction.

3. The display panel of claim 1, wherein a width of the auxiliary wiring in the first direction is greater than a width of each of the first pixels and second pixels in the first direction.

4. The display panel of claim 1, wherein the first voltage wiring includes:
a first portion directly connected to a first end of the auxiliary wiring on the edge non-display region and extending in the first direction; and
a second portion directly connected to a second end of the auxiliary wiring on the edge non-display region and extending in the first direction.

5. The display panel of claim 1, wherein the second voltage wiring includes:
a first portion directly connected to a first end of the auxiliary wiring on the edge non-display region and extending in the first direction; and
a second portion directly connected to a second end of the auxiliary wiring on the edge non-display region and extending in the first direction.

6. The display panel of claim 5, wherein:
the first voltage wiring includes a first portion and a second portion, the first portion and second portion completely crossing between the first display region and the second display region on the intermediate non-display region, and
the first portion and second portion of the first voltage wiring have the auxiliary wiring therebetween, and each of the first portion and second portion extends parallel to the auxiliary wiring.

7. The display panel of claim 5, wherein the first voltage wiring includes a first portion that extends in the second direction on the intermediate non-display region and completely crosses between the first display region and second display region, and overlaps the auxiliary wiring.

8. The display panel of claim 1, further comprising:
   first gate lines each extending in the first direction on the first display region and each connected to first pixels on an identical row among the first pixels;
   second gate lines each extending in the first direction on the second display region and each connected to second pixels on an identical row among the second pixels;
   a first gate driving circuit between the first display region and the auxiliary wiring on the intermediate non-display region to drive the first gate lines; and
   a second gate driving circuit between the second display region and the auxiliary wiring on the intermediate non-display region to drive the second gate lines.

9. The display panel of claim 8, further comprising a protection layer directly connected to the auxiliary wiring and covering the first gate driving circuit and second gate driving circuit on the intermediate non-display region.

10. The display panel of claim 1, wherein:
    the substrate includes at least one transparent region within the intermediate non-display region, and
    the auxiliary wiring includes at least one opening corresponding to the at least one transparent region.

11. The display panel of claim 1, further comprising:
    first voltage lines each extending in the second direction on the first display region and each connected to first pixels on an identical column among the first pixels; and
    second voltage lines each extending in the second direction on the second display region and each connected to second pixels on an identical column among the second pixels,
    wherein the first voltage wiring includes:
       a first portion directly connected to first ends of the first voltage lines on the edge non-display region and extending in the first direction;
       a second portion directly connected to second ends of the first voltage lines on the edge non-display region and extending in the first direction;
       a third portion directly connected to first ends of the second voltage lines on the edge non-display region and extending in the first direction; and
       a fourth portion directly connected to second ends of the second voltage lines on the edge non-display region and extending in the first direction.

12. The display panel of claim 1, further comprising a common electrode directly connected to the second voltage wiring and entirely covering the first display region and second display region to apply the second driving voltage to the first pixels and second pixels.

13. The display panel of claim 1, wherein:
    each of the first pixels and second pixels includes a light-emitting device and a pixel circuit that generates light-emission current flowing in the light-emitting device,
    the light-emitting device includes a pixel electrode, a common electrode to which the second driving voltage is applied, and an intermediate layer between the pixel electrode and the common electrode, and
    the pixel circuit is connected to the pixel electrode, the first driving voltage is applied to the pixel circuit, and the pixel circuit includes at least one thin film transistor.

14. The display panel of claim 13, further comprising:
    an active layer on the substrate, the active layer including a source region, a channel region, and a drain region of the at least one thin film transistor;
    a first conductive layer on the substrate, the first conductive layer including a gate electrode of the at least one thin film transistor that overlaps the channel region;
    a second conductive layer on the first conductive layer, the second conductive layer including a connection electrode that connects one of the source region and the drain region to the pixel electrode;
    a third conductive layer on the second conductive layer, the third conductive layer including the pixel electrode; and
    a common electrode on the third conductive layer.

15. The display panel of claim 14, wherein the auxiliary wiring includes an auxiliary wiring electrode of the second conductive layer.

16. The display panel of claim 14, wherein the auxiliary wiring includes an auxiliary wiring electrode and a lower auxiliary wiring electrode of the first conductive layer, the lower auxiliary wiring electrode being connected to a lower part of the auxiliary wiring electrode.

17. The display panel of claim 14, wherein the auxiliary wiring includes an auxiliary wiring electrode and an upper auxiliary wiring electrode of the third conductive layer, the upper auxiliary wiring electrode being connected to an upper part of the auxiliary wiring electrode.

18. An electronic apparatus, comprising:
    the display panel of claim 1;
    a power supply to supply the first driving voltage and second driving voltage to the display panel; and
    a processor to provide image data to the display panel.

19. The electronic apparatus of claim 18, further comprising:
    a first optical system in front of the first display region of the display panel; and
    a second optical system in front of the second display region of the display panel.

20. The electronic apparatus of claim 19, wherein the electronic apparatus is a head mounted display apparatus mountable on a head or a face.

* * * * *